US011785767B2

(12) United States Patent
Kim et al.

(10) Patent No.: US 11,785,767 B2
(45) Date of Patent: Oct. 10, 2023

(54) SEMICONDUCTOR DEVICES

(71) Applicant: Samsung Electronics Co., Ltd., Suwon-si (KR)

(72) Inventors: Youngwoo Kim, Hwaseong-si (KR); Dawoon Jeong, Hwaseong-si (KR); Tak Lee, Hwaseong-si (KR); Jungmin Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 332 days.

(21) Appl. No.: 17/159,727

(22) Filed: Jan. 27, 2021

(65) Prior Publication Data
US 2021/0391346 A1    Dec. 16, 2021

(30) Foreign Application Priority Data

Jun. 10, 2020    (KR) .................. 10-2020-0070205

(51) Int. Cl.
*H10B 41/27*    (2023.01)
*H10B 41/10*    (2023.01)
*H10B 43/10*    (2023.01)
*H10B 43/27*    (2023.01)

(52) U.S. Cl.
CPC ............. *H10B 41/27* (2023.02); *H10B 41/10* (2023.02); *H10B 43/10* (2023.02); *H10B 43/27* (2023.02)

(58) Field of Classification Search
CPC ......... H01L 27/11556; H01L 27/11519; H01L 27/11565; H01L 27/11582; H10B 41/27; H10B 43/10; H10B 43/27; H10B 41/20
See application file for complete search history.

(56) References Cited

U.S. PATENT DOCUMENTS

| | | | |
|---|---|---|---|
| 9,536,897 B2 | 1/2017 | Yoo et al. | |
| 10,546,874 B2 | 1/2020 | Kim et al. | |
| 2016/0343727 A1 | 11/2016 | Kim et al. | |
| 2019/0139985 A1* | 5/2019 | Kim | ............ H10B 43/50 |
| 2019/0304991 A1 | 10/2019 | Seo et al. | |
| 2019/0319038 A1 | 10/2019 | Zhang | |
| 2019/0326308 A1 | 10/2019 | Pu et al. | |
| 2019/0371808 A1 | 12/2019 | Choi et al. | |

FOREIGN PATENT DOCUMENTS

KR    20160136919    11/2016

* cited by examiner

*Primary Examiner* — Evren Seven
*Assistant Examiner* — Cole Leon Lindsey
(74) *Attorney, Agent, or Firm* — Myers Bigel, P.A.

(57) ABSTRACT

A semiconductor device includes a substrate having a first region and a second region, insulating patterns in the substrate in the second region that define active patterns of the substrate, gate electrodes spaced apart from each other and stacked on an upper surface of the substrate and extending in a first direction, first separation regions extending in the first direction and in contact with the active patterns, second separation regions extending between the first separation regions in the first direction, and channel structures penetrating through the gate electrodes in the first region. At least one of the second separation regions is in contact with the substrate below the insulating patterns.

20 Claims, 43 Drawing Sheets

SEMICONDUCTOR DEVICES

CROSS-REFERENCE TO RELATED APPLICATION(S)

This application claims benefit of priority to Korean Patent Application No. 10-2020-0070205 filed on Jun. 10, 2020 in the Korean Intellectual Property Office, the disclosure of which is incorporated herein by reference in its entirety.

BACKGROUND

The present disclosure relates to semiconductor devices.

Efforts have been made to reduce a volume and/or size of semiconductor devices that perform high-capacity data processing. Reducing the volume and/or size of such devices may be accomplished by increasing their integration. To improve the integration of semiconductor devices, semiconductor devices having a vertical transistor structure instead of a planar transistor structure have been proposed.

SUMMARY

Example embodiments of the present disclosure provide semiconductor devices having improved integration and electrical characteristics.

According to an example embodiment, a semiconductor device includes a substrate having a first region and a second region, insulating patterns in the substrate in the second region that define an active structure of the substrate, a stacked structure including interlayer insulating layers and gate electrodes that are alternately and repeatedly stacked on the substrate, first separation regions penetrating through the stacked structure, extending in a first direction, and spaced apart from each other in a second direction, perpendicular to the first direction, second main separation regions penetrating through the stacked structure between the first separation regions and spaced apart from each other in the first direction, second auxiliary separation regions penetrating through the stacked structure on the second region, spaced apart from the first separation regions and the second main separation regions in the second direction, and spaced apart from each other in the first direction, and channel structures penetrating through the stacked structure on the first region. The active structure includes active patterns that are in contact with the first separation regions between the insulating patterns of the second region and extending in the first direction, and second active patterns extending for a shorter length than the first active patterns between the first active patterns. At least one of the second main separation regions includes a first portion in contact with at least one of the second active patterns and a second portion that extends through the insulating pattern to contact the substrate. A lower end of the second portion is lower than a lower end of the first portion.

According to an example embodiment, a semiconductor device includes a substrate having a first region and a second region, insulating patterns in the substrate in the second region that define active patterns of the substrate, gate electrodes spaced apart from each other and stacked on an upper surface of the substrate and extending in a first direction, first separation regions extending in the first direction and in contact with the active patterns, second separation regions extending between the first separation regions in the first direction, and channel structures penetrating through the gate electrodes on the first region. At least one of the second separation regions is in contact with the substrate below the insulating patterns.

According to an example embodiment, a semiconductor device includes a substrate having a first region and a second region, gate electrodes spaced apart from each other and stacked on the substrate, at least two of the gate electrodes extending for different lengths on the second region, in a first direction, first separation regions, extending in the first direction, the first separation regions separating ones of the gate electrodes and spaced apart from each other in a direction perpendicular to the first direction, and a second separation region extending from the first region to the second region between the first separation regions in the first direction, the second separation region penetrating through the gate electrodes. The second separation region has a bottom surface at a first vertical distance from an upper surface of the second separation region, in the second region, and a second bottom surface at a second vertical distance greater than the first vertical distance, from the upper surface of the second separation region.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments of the present disclosure will be described with reference to the accompanying drawings.

Figure 1:
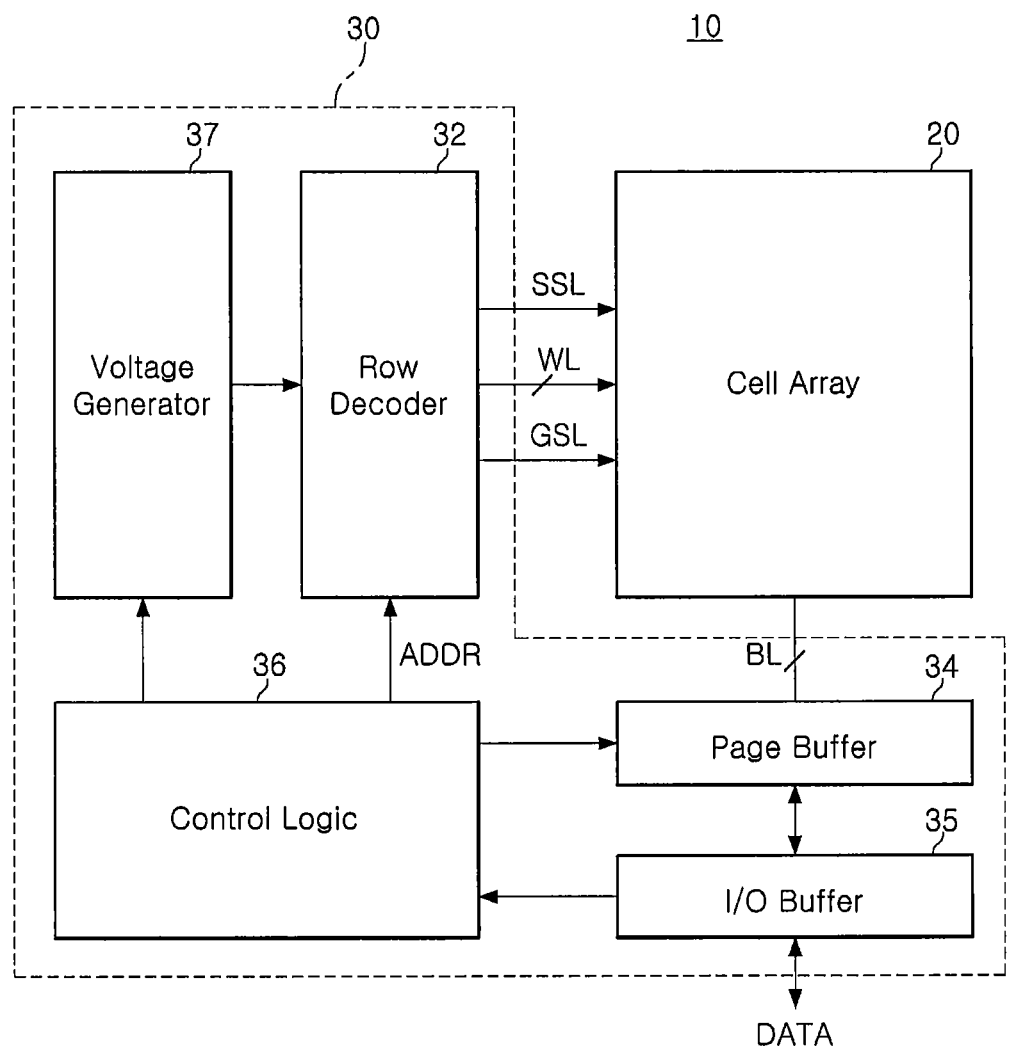
FIG. 1 is a schematic block diagram of a semiconductor device according to example embodiments of the present disclosure.

FIG. 1 is a schematic block diagram of a semiconductor device according to example embodiments of the present disclosure.

Referring to FIG. 1, a semiconductor device 10 may include a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each memory block may include a plurality of memory cells. The plurality of memory cells may be connected to the row decoder 32 through string selection lines SSL, word lines WL, and ground selection lines GSL, and may be connected to the page buffer 34 through bit lines BL. In example embodiments, a plurality of memory cells arranged along the same row may be connected to the same word line WL, and a plurality of memory cells arranged along the same column may be connected to the same bit line BL.

The row decoder 32 may decode an input address ADDR to generate and transmit driving signals of a word line WL. The row decoder 32 may provide a word line voltage, generated from the voltage generator 37, to a selected word line WL and an unselected word lines WL in response to control of the control logic 36.

The page buffer 34 may be connected to the memory cell array 20 through bit lines BL to read information stored in the memory cells. The page buffer 34 may temporarily store data to be stored in the memory cells or may sense data stored in the memory cells according to an operating mode. The page buffer 34 may include a column decoder and a sense amplifier. The column decoder may selectively activate bit lines BL of the memory cell array 20, and the sense amplifier may sense a voltage of a bit line BL selected by the column decoder to read the data, stored in the memory cell, during a read operation.

The input/output buffer 35 may receive data DATA and transfer the received data DATA to the page buffer 34 during a program operation and may output data DATA, received from the page buffer 34, to an external entity during a read operation. The input/output buffer 35 may transmit an input address or instruction to the control logic 36.

The control logic 36 may control the operations of the row decoder 32 and the page buffer 34. The control logic 36 may receive a control signal and an external voltage, transmitted externally, and may operate according to the received control signal. The control logic 36 may control a read operation, a write operation, and/or an erase operation in response to the control signals.

The voltage generator 37 may generate voltages required for an internal operation, for example, a program voltage, a read voltage, an erase voltage, and the like, using an external voltage. The voltages generated by the voltage generator 37 may be transmitted to the memory cell array 20 through the row decoder 32.

Figure 2:
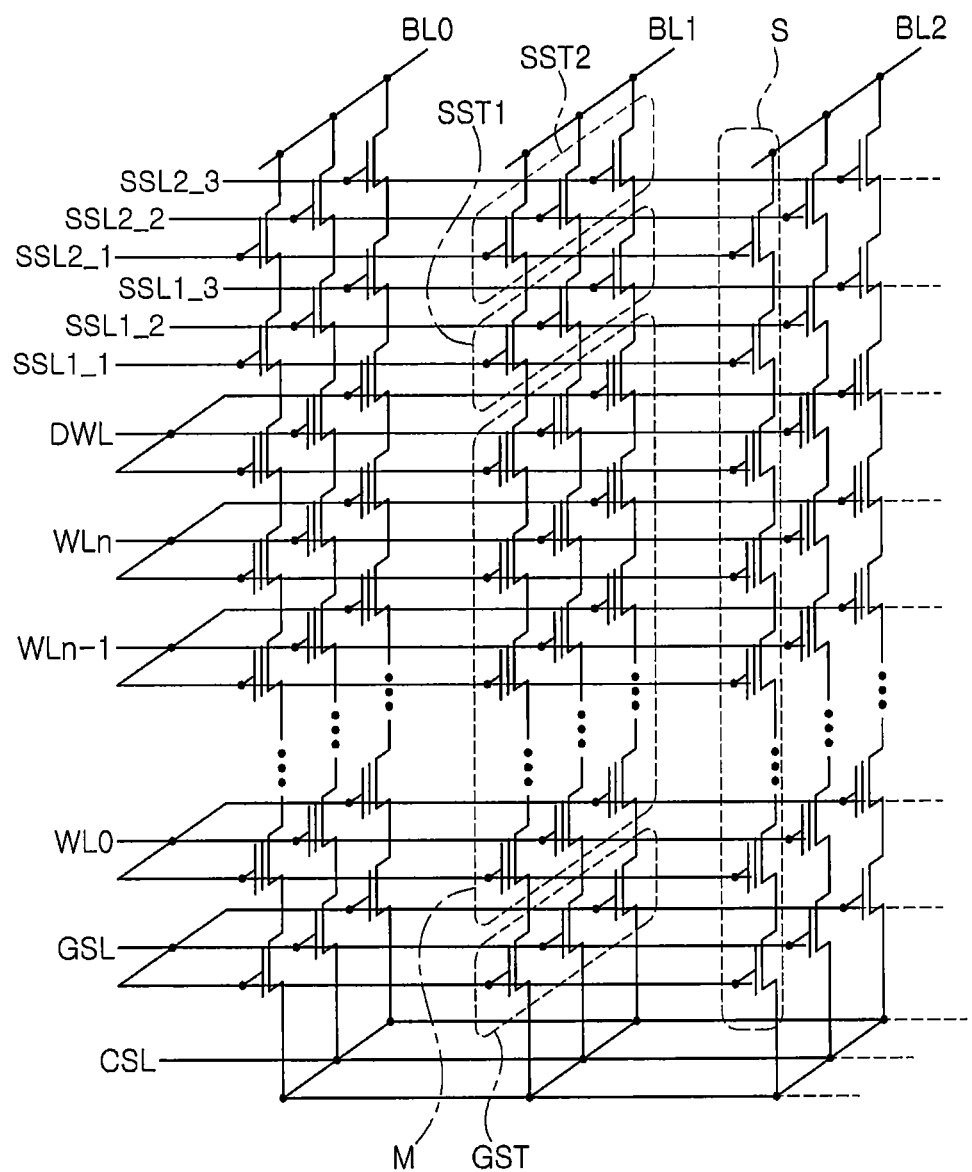
FIG. 2 is an equivalent circuit diagram of a cell array of a semiconductor device according to example embodiments of the present disclosure.

FIG. 2 is an equivalent circuit diagram of a cell array of a semiconductor device according to example embodiments of the present disclosure.

Referring to FIG. 2, the memory cell array 20 may include memory cells M connected to each other in series and a plurality of memory cell strings S including a ground select transistor GST and string select transistors SST1 and SST2 connected to opposing ends of the memory cells M in series. The plurality of memory cell strings S may be connected to bit lines BL0 to BL2 in parallel. The plurality of memory cell strings S may be commonly connected to a common source line CSL. For example, the plurality of memory cell strings S may be disposed between the plurality of bit lines BL0 to BL2 and a single common source line CSL. In an example embodiment, a plurality of common source lines CSL may be two-dimensionally disposed.

Memory cells M, connected to each other in series, may be controlled by word lines WL0 to WLn for selecting the memory cells M. Each of the memory cells M may include a data storage element. Gate electrodes of the memory cells M, disposed at substantially the same distance from the common source line CSL, may be commonly connected to one of the word lines WL0 to WLn to enter an equipotential state. Alternatively, even when gate electrodes of the memory cells M are disposed at substantially the same distance from the common source lines CSL, gate electrodes disposed in different rows or columns may be independently controlled.

A ground select transistor GST may be controlled by a ground select line GSL and may be connected to the common source line CSL. String select transistors SST1 and SST2 may be controlled by string select lines SSL1_1, SSL1_2, SSL1_3, SSL2_1, SSL2_2, and SSL2_3 and may be connected to bit lines BL0 to BL2. FIG. 2 illustrates a structure in which one ground select transistor GST and two string select transistors SST1 and SST2 are connected to a plurality of memory cells M connected to each other in series, but each of the string select transistors SST1 and SST2 may be connected thereto or a plurality of ground select transistors GST may be connected thereto. One or more dummy lines DWL or buffer lines may be further disposed between an uppermost word line WLn, among the word lines WL0 to WLn, and the string select lines SSL1_1, SSL1_2, SSL1_3, SSL2_1, SSL2_2, and SSL2_3. In an example embodiment, one or more dummy lines DWL may be disposed between a lowermost word line WL0 and the ground select line GSL.

When a signal is applied to the string select transistors SST1 and SST2 through the string select lines SSL1_1, SSL1_2, SSL1_3, SSL2_1, SSL2_2, and SSL2_3, an applied signal may be transmitted to the memory cells M, connected in series through the bit lines BL0 to BL2, to perform data read and write operations. In addition, an erase operation may be performed to erase data written in the memory cells M by applying a predetermined erase voltage through a substrate. In an example embodiment, the memory cell array 20 may include at least one dummy memory cell string electrically separated from the bit lines BL0 to BL2.

Figure 3A:
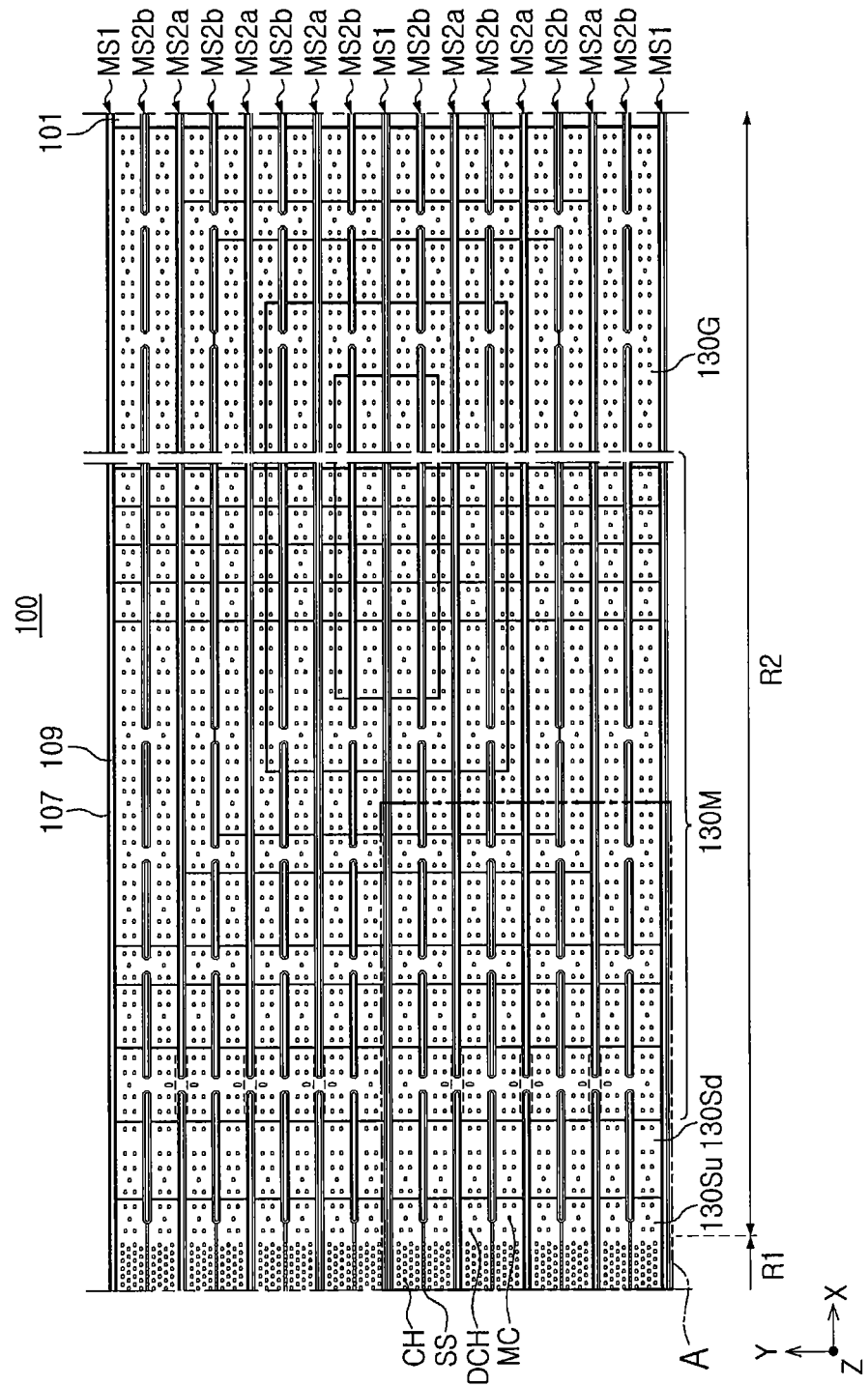
FIG. 3A is a schematic plan view of a semiconductor device according to example embodiments of the present disclosure.
Figure 3B:
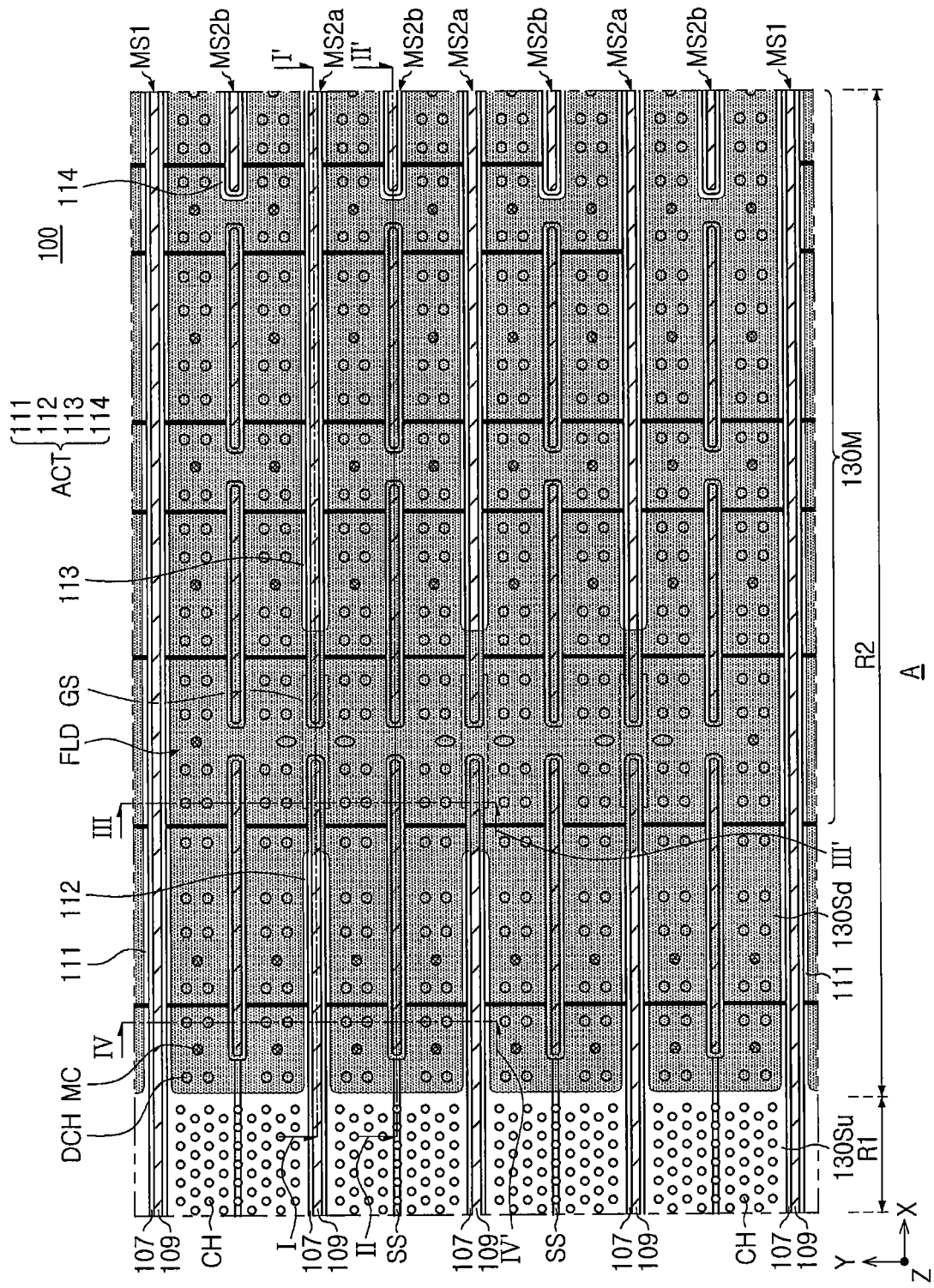
FIG. 3B is a partially enlarged schematic plan view of portion 'A' in FIG. 3A.
Figure 3C:
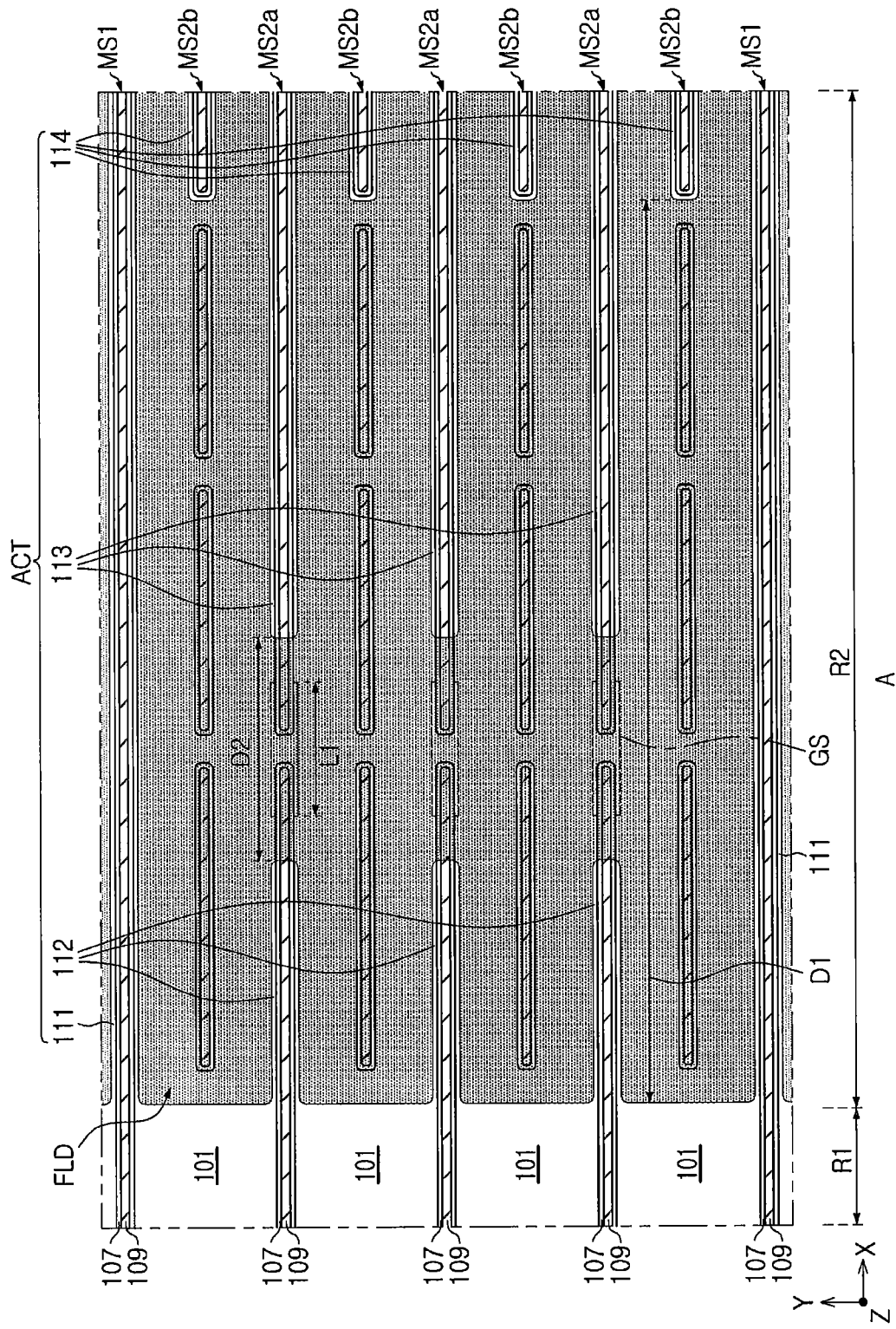
FIG. 3C is a plan view illustrating some elements of a semiconductor device according to example embodiments of the present disclosure.

FIG. 3A is a schematic plan view of a semiconductor device according to example embodiments of the present disclosure, and FIG. 3B is a partially enlarged schematic plan view of portion 'A' in FIG. 3A. FIG. 3C is a partially enlarged plan view illustrating some elements of a semiconductor device according to example embodiments of the present disclosure.

FIGS. 4A to 4D are cross-sectional views of a semiconductor device according to example embodiments of the present disclosure, respectively. FIGS. 4A to 4D are cross-sectional views taken along lines and IV-IV' in FIG. 3B, respectively.

Referring to FIGS. 3A to 4D, a semiconductor device 100 may include a substrate 101 having a first region R1 and a second region R2, insulating patterns FLD disposed in a substrate 101 in the second region R2, a stacked structure including interlayer insulating layers 120 and gate electrodes 130 alternately stacked on the substrate 101, channel structures CH disposed to penetrate through the stacked structure, first and second separation regions MS1, MS2a, and MS2b extending through the stacked structure, upper separation regions SS penetrating through a portion of an uppermost gate electrode 130, and lower separation regions GS penetrating through a portion of a lowermost gate electrode 130. The semiconductor device 100 may further include dummy channel structures DCH, first and second capping insulating layers 171 and 172, and contact plugs MC.

The first region R1 of the substrate 101 may be a region in which the gate electrodes 130 are vertically stacked and the channel structures CH are disposed, and may be a region corresponding to the memory cell array 20 of FIG. 1. The first region R1 may be referred to as a memory cell array region. The second region R2 of the substrate 101 may be a region in which the gate electrodes 130 extend to have different lengths and the dummy channel structures DCH are disposed, and may correspond to a region electrically connecting the memory cell array 20 and the peripheral circuit 30 of FIG. 1. The second region R2 may be referred to as a connecting region or a step region. The second region R2 may be disposed in at least one end of the first region R1 in at least one direction, for example, a first direction X.

The substrate 101 may have an upper surface extending in the first direction X and a second direction Y. The substrate 101 may include a semiconductor material such as a group IV semiconductor, a group III-V compound semiconductor, or a group II-VI oxide semiconductor. For example, the group IV semiconductor may include silicon, germanium, or silicon-germanium. The substrate 101 may be provided as a bulk wafer or an epitaxial layer. The first direction X and the second direction Y may vertically intersect each other.

The insulating patterns FLD may be disposed in the substrate 101 in the second region R2. The insulating patterns FLD may be disposed in the substrate 101 to have a predetermined pattern in the second region R2, as illustrated in FIG. 3C. The insulating patterns FLD may be formed by, for example, a shallow trench isolation (STI) process. The insulating patterns FLD may extend inwardly of the substrate 101 from an upper surface of the substrate 101 to a predetermined depth. The insulating patterns FLD may be formed of an insulating material and may include, for example, oxide, nitride, or a combination thereof.

The insulating patterns FLD may define an active structure ACT of the substrate 101 in the second region R2, as illustrated in FIG. 3C. The active structure ACT may have a shape protruding upwardly further than bottom surfaces of the insulating patterns FLD. The active structure ACT may include impurities or may have doped regions including impurities. The active structure ACT may include the same material as the substrate 101 and may be formed of a material different from a material of the insulating patterns FLD.

The active structure ACT may include first active patterns 111, extending between the insulating patterns FLD of the second region R2 in a first direction X, and second active patterns 112 having a shorter length than the first active patterns 111 and extending in the first direction X. In this case, the length may refer to a length in the first direction X in which the active patterns extend. The active structure ACT may further include third active patterns 113 spaced apart from the second active pattern 112 in the first direction X on one straight line (e.g., collinearly) in which each of the second active patterns 112 and the third active patterns 113 extend in the first direction X, and fourth active patterns 114 disposed between the third active patterns 113 and between the third active patterns 113 and the first active patterns 111.

The first active patterns 111 may overlap a first separation region MS1 in the second region R2 in a third direction Z. The first active patterns 111 may be disposed below the first separation region MS1. The insulating patterns FLD may not be in contact with the first separation region MS1. The third direction Z may be perpendicular to an upper of the substrate 101 and/or perpendicular to the first and second directions X and Y.

The second active patterns 112 may overlap a portion of the second main separation region MS2a in the second region R2 in the third direction Z. The second active patterns 112 may be disposed below a portion of the second main separation region MS2a. The second active patterns 112 may extend in the first direction X from the first region R1 to the second region R2. The second active patterns 112 may be locally disposed in a portion of the second region R2 adjacent to the first region R1. The second active patterns 112 may be disposed to be spaced apart from each other in the second direction Y between the first active patterns 111. In the first direction X in which the second active patterns 112 extend, ends or side surfaces of the second active patterns 112 may overlap the second main separation region MS2a in the third direction Z. The second main separation region MS2a may be disposed across the second active patterns 112 and the insulating patterns FLD.

The third active patterns 113 may be spaced apart from the second active patterns 112 in the first direction X by a portion of the insulating patterns FLD. The third active patterns 113 may be in contact with the second main separation regions MS2a in the second region R2. The third active patterns 113 may be disposed below a portion of the second main separation region MS2a. Ends or side surfaces of the third active patterns 113 may also be in contact with the second main separation region MS2a. The third active patterns 113 may extend in the first direction X to have a greater length than the second active patterns 112. Each of the third active patterns 113 may have a shorter length than each of the first active patterns 111.

The fourth active patterns 114 may be in contact with at least one auxiliary second separation region among second auxiliary separation regions MS2b in the second region R2. The fourth active patterns 114 may be disposed below at least one of the second auxiliary separation region MS2b. Among the second auxiliary separation regions MS2b, at least one second auxiliary separation region MS2b that is not in contact with the fourth active patterns 114 may be in contact with the insulating patterns FLD. A plurality of fourth active patterns 114 may be spaced apart from each other in the first direction X. A plurality of fourth active patterns 114 may also be spaced apart from each other in the second direction Y.

In the second region R2, the fourth active patterns 114 may extend from a point spaced apart from ends of the insulating patterns FLD adjacent to the first region R1 of the insulating patterns FLD by a first distance D1. In an example embodiment, the first distance D1 may range from about 6 µm to about 8 µm. In an example embodiment, the first distance D1 may range from about 7 µm to about 8 µm.

A lower insulating layer 160 of a lower separation region GS may have a first length L1 in the first direction X. A second distance D2 of some of the insulating patterns FLD, by which the second active pattern 112 and the third active pattern 113 are spaced apart from each other, in the first direction X may be greater than the first length L1. The second distance D2 may refer to a distance between adjacent ends of the second active pattern 112 and the third active pattern 113. In an example embodiment, the first length L1 may range from about 1 µm to about 2 µm. In an example embodiment, the second distance D2 may range from about 1.5 µm to about 2.5 µm.

The gate electrodes 130 are vertically stacked to be spaced apart from each other on the first region R1, and some of the gate electrodes 130 may extend from the first region R1 to the second region R2 by different lengths.

The gate electrodes 130 include a ground selection gate electrode 130G constituting a gate of the ground selection transistor GST of FIG. 2, memory cell gate electrodes 130M constituting a plurality of memory cells M, and string selection gate electrodes 130Sd and 130Su constituting gates of the string selection transistors SST1 and SST2. The number of memory cell gate electrodes 130M, constituting the memory cells M, may be determined depending on capacity of the semiconductor device 100. According to example embodiments, one or two or more string selection gate electrodes 130Sd and 130Su and one or two or more ground selection gate electrode 130G may be provided, and may have the same structure as the gate electrodes 130 of the memory cells M or structures different from those of the gate electrodes 130 of the memory cells M.

As illustrated in FIGS. 3A and 3B, the gate electrodes 130 may be disposed to be separated from each other in predetermined units in the second direction Y by the first separation regions MS1 extending in the first direction X. The gate electrodes 130 between a pair of first separation regions MS1 may constitute a single memory block, but the range of the memory block is not limited thereto.

The memory cell gate electrodes 130M may constitute a single layer in a single memory block. Each of the memory cell gate electrodes 130M may include eight sub-gate electrodes extending between a pair of first separation regions MS1 in the first direction X, and the second separation regions MS2a, and may be connected by gate connection portions 130CP to be disposed as a single layer in a region in which the second isolation regions MS2a and MS2b are spaced apart from each other in the first direction X. The gate connection portions 130CP refer to regions in which the gate electrodes 130 are horizontally connected to each other on the same level.

The string selection gate electrodes 130Sd and 130Su may be completely separated into eight sub-gate electrodes between a pair of first separation regions MS1 by the first and second separation regions MS1, MS2a, and MS2b and the upper separation region SS, but the present disclosure is not limited thereto.

Ground selection gate electrodes 130G may be connected between some of the second separation regions MS2a and MS2b by the gate connection portions 130CP, but may be separated into four sub-gate electrodes between the second main separation regions MS2a by the second main separation regions MS2a and the lower separation regions GS, but the present disclosure is not limited thereto.

In the second region R2 of the substrate 101, the gate electrodes 130 may extend in the first direction X by different lengths to form step portions and a pad region, in which an underlying gate electrode 130 is exposed upwardly, may be provided. In this specification, the term "pad region" may refer to overall region in which the gate electrodes 130 form step portions in the second region R2. A certain number of gate electrodes 130, for example, one, two, four, or five gate electrodes 130, may constitute a single gate group to form a step structure between the gate groups in the first direction X. The gate electrodes 130, constituting the single gate group, may also be disposed to mutually have a step structure in the second direction Y.

Each of the gate electrodes 130 may be upwardly exposed in the pad regions to be connected to the contact plugs MC to connect the gate electrodes 130 to an interconnection structure disposed thereon. In the pad regions, the gate electrodes 130 may have a region in which thicknesses of the gate electrodes 130 are increased to stably connect the gate electrodes 130 to the contact plugs MC, but the present disclosure is not limited thereto.

The gate electrodes 130 may include a metallic material, for example, tungsten (W). According to example embodiments, the gate electrodes 130 may include polycrystalline silicon or a metal silicide material.

In an example embodiment, the gate electrodes 130 may include an internal gate conductive layer and a diffusion barrier 133 surrounding the gate conductive layer. The diffusion barrier 133 may include, for example, a tungsten nitride (WN), a tantalum nitride (TaN), a titanium nitride (TiN), graphene, or combinations thereof.

Interlayer insulating layers 120 may be disposed between the gate electrodes 130. Similarly to the gate electrodes 130, the interlayer insulating layers 120 may be disposed to be spaced apart from each other in the third direction Z, perpendicular to an upper surface of the substrate 101, and to extend in the first direction X. The interlayer insulating layers 120 may include an insulating material such as a silicon oxide or a silicon nitride.

Channel structures CH may be disposed to be spaced apart from each other while forming rows and columns on the first region R1. The channel structures CH may be disposed to form a lattice pattern or may be disposed in a zigzag form in a direction. The channel structures CH may vertically extend on the substrate 101. The channel structures CH may have a columnar shape, and may have an inclined side surfaces narrowed in a direction toward the substrate 101 according to an aspect ratio. Among the channel structures CH disposed in the first region R1, some channel structures CH adjacent to the second region R2 may be dummy channels. Channel structures CH, overlapping the upper separation regions SS, may also be dummy channels. In this case, the dummy channels may have the same or similar structure as the channel structures CH, but may not perform a substantial function in the semiconductor device 100.

A channel layer 140 may be disposed in the channel structures CH. In the channel structures CH, the channel layer 140 may be formed to have an annular shape surrounding an internal channel insulating layer 150. However, according to example embodiments, the channel layer 140 may have a column shape such as a cylindrical shape or a prismatic shape without the channel insulating layer 150. The channel layer 140 may be on and/or connected to the epitaxial layer 105 therebelow, and an insulating layer may be further disposed between the channel layer 140 and the epitaxial layer 105. The channel layer 140 may include a semiconductor material such as polycrystalline silicon or single-crystalline silicon. The semiconductor material may be an undoped material or a material including p-type or n-type impurities. The channel structures CH, disposed on a straight line in the second direction Y, may be respectively connected to different bit lines BL0 to BL2 (see FIG. 2) according to disposition of an upper interconnection structure connected to the channel pad 155.

In the channel structures CH, channel pads 155 may be disposed on the channel layer 140. The channel pads 155 may be disposed to cover an upper surface of the channel insulating layer 150 and to be electrically connected to the channel layer 140. The channel pads 155 may include, for example, doped polycrystalline silicon.

A gate dielectric layer 145 may be disposed between the gate electrodes 130 and the channel layer 140. The gate dielectric layer 145 may include a tunneling layer, an data storage layer, and a blocking layer sequentially stacked from the channel layer 140. The tunneling layer may tunnel charges to the data storage layer and may include, for example, a silicon oxide ($SiO_2$), a silicon nitride ($Si_3N_4$), a silicon oxynitride (SiON), or combinations thereof. The blocking layer may include, for example, a silicon oxide ($SiO_2$), a silicon nitride ($Si_3N_4$), a silicon oxynitride (SiON), a high-k dielectric material, or combinations thereof.

An epitaxial layer 105 may be disposed on the substrate 101 at a lower end of the channel structures CH and may be disposed on a side surface of at least one of the gate electrodes 130. The epitaxial layer 105 may be disposed in a recessed region of the substrate 101. In some embodiments, an upper surface of the epitaxial layer 105 may be higher than an upper surface of a lowermost gate electrode 130 and lower than a bottom surface of a gate electrode 130 disposed thereon, but is not limited to that illustrated in the drawing. In example embodiments, the epitaxial layer 105 may be omitted. In this case, the channel layer 140 may be directly connected to the substrate 101.

A dummy channel structure DCH may be disposed in the second region R2 and may have the same or similar structure as the channel structures CH, but may not perform a substantial function in the semiconductor device 100. The dummy channel structures DCH may be disposed to be connected (e.g., electrically connected) to the substrate 101. In some embodiments, the dummy channel structures DCH may extend into and/or through the insulating patterns FLD to be connected to the substrate 101. The dummy channel structures DCH may be regularly disposed in columns and rows in the pad regions of the gate electrodes 130. Each of the dummy channel structures DCH may have a size (a maximum diameter) larger than that of each of the channel structures CH. The number and/or spacing of the dummy channel structures DCH may be different according to example embodiments.

Since the dummy channel structures DCH are disposed to penetrate into and/or through the insulating patterns FLD, a lower end of each of the dummy channel structures DCH may be disposed to be lower than a lower end of each of the channel structures CH. Accordingly, the dummy channel structures DCH may be longer (e.g., have a greater height) than the channel structures CH. In addition, the epitaxial layers 105 in the dummy channel structures DCH may be disposed such that at least a portion of the side surfaces of the epitaxial layers 105 is surrounded by insulating patterns FLD.

The first and second separation regions MS1, MS2a, and MS2b may be disposed to extend in the first region R1 and the second region R2 in the first direction X. The first and second separation regions MS1, MS2a, and MS2b may be disposed parallel to each other. The first separation regions MS1 and the second separation regions MS2a and MS2b may be disposed to form a constant pattern in the second direction Y, and the second separation regions MS2a and MS2b may be disposed to be spaced apart from each other on a straight line (e.g., collinearly) in the first direction X. The first separation regions MS1 may be disposed to be spaced apart from each other in the second direction Y, and the gate electrodes 130 may be spaced apart from each other in the second direction Y by the first separation regions MS1. The first and second separation regions MS1, MS2a, and MS2b may be through-separation regions connected to the substrate 101 through the entire gate electrodes 130 stacked on the substrate 101. The second separation regions MS2a and MS2b may reduce a stress applied to the gate electrodes 130 as the number of stacked gate electrodes 130 is increased.

The second separation regions MS2a and MS2b may include second main separation regions MS2a, disposed to be spaced apart from each other between a pair of first separation regions MS1 at a predetermined interval in the second direction Y, and second auxiliary separation regions MS2b disposed to be spaced apart from each other between the first separation region MS1 and the second main separation region MS2a and between the second main separation regions MS2a at a predetermined interval in the second direction Y.

The second main separation regions MS2a may be disposed across the entire first and second regions R1 and R2. The second auxiliary separation regions MS2b may be disposed in only the second region R2. A plurality of second main separation regions MS2a may be disposed to be separated on a straight line at predetermined intervals. A plurality of second auxiliary separation regions MS2b may be disposed to be separated on a straight line at predetermined intervals.

The first separation regions MS1 may be in contact with the first active patterns 111. The first separation regions MS1 may be disposed to partially recess upper portions of the first active patterns 111, or may be disposed on the substrate 101 to be in contact with the upper surfaces of the first active patterns 111.

Hereinafter, cross-sectional structures of the first and second separation regions MS1, MS2a, and MS2b will be described with reference to FIGS. 3B, 3C, and 4A to 4D.

Figure 4A:
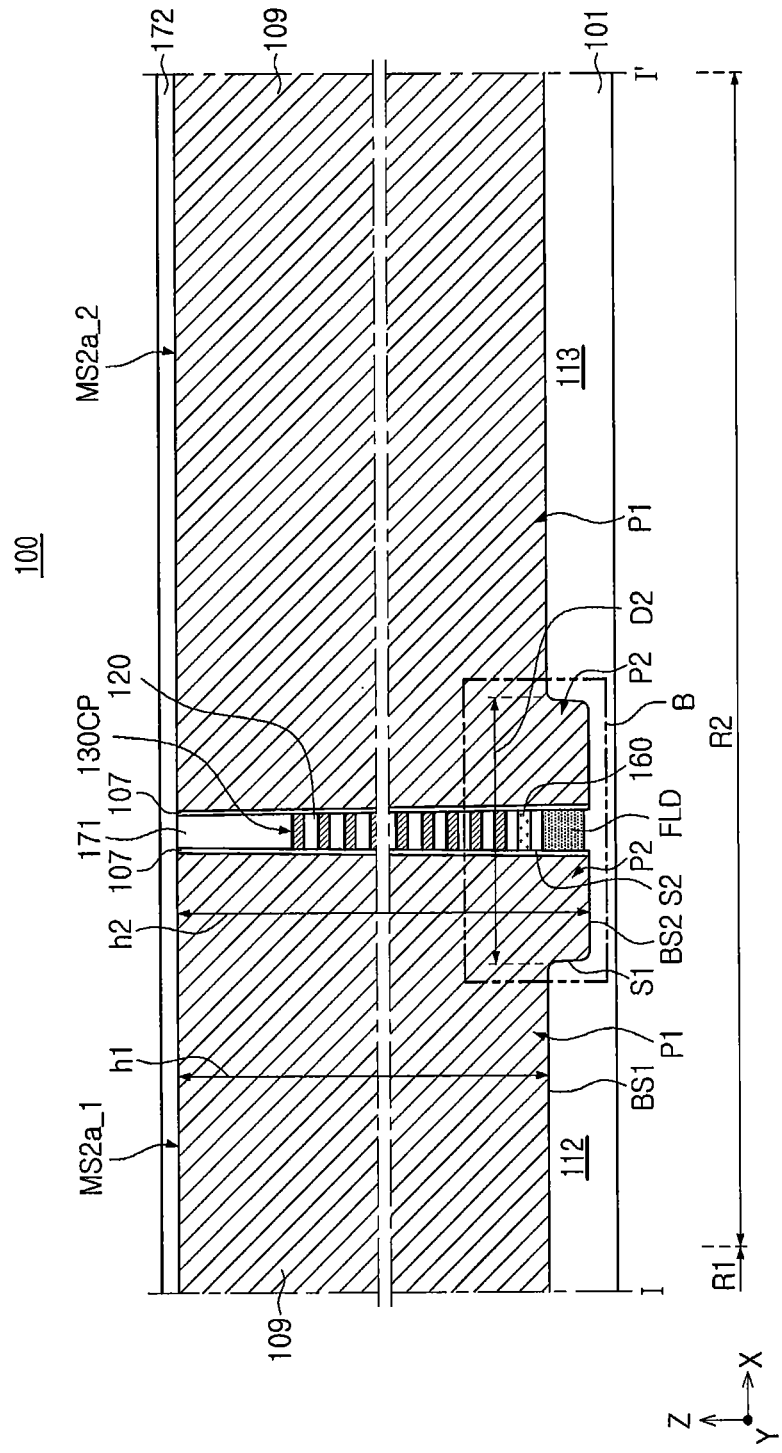
FIGS. 4A to 4D are cross-sectional views of semiconductor devices according to example embodiments of the present disclosure.

Referring to FIGS. 3B and 4A, the second main separation regions MS2a may include a second main separation region MS2a_1, extending continuously from the first region R1 to a portion of the second region R2, and a second main separation region MS2a_2 spaced apart from the second region R2 to extend continuously in the first direction X.

The second main separation region MS2a_1 may include a first portion P1, disposed to be in contact with second active patterns 112, and a second portion P2 penetrating through the first portion P1 and insulating patterns FLD to be in contact with a substrate 101. A lower end (e.g., a bottom surface) of the second portion P2 may be disposed to be lower than a lower end of the first portion P1. A second vertical depth h2 between the lower end of the second portion P2 and an upper end of the second main separation region MS2a_1 may be greater than a first vertical depth h1 between the lower end of the first portion P1 and the upper end of the second main separation region MS2a_1. The term "vertical depth" may refer to a depth in the third direction Z. The lower end of the second portion P2 may be disposed to be lower than upper surfaces of the second active patterns 112. The lower end of the second portion P2 may be disposed to be lower than bottom surfaces of the insulating patterns FLD. As illustrated in the enlarged view of FIG. 4C, the lower end of the second portion P2 may be disposed to be lower than the lower end of the first separation regions MS1.

The second main separation region MS2a_1 may extend to be in contact with the substrate 101 below the bottom surfaces of the insulating patterns FLD while being in contact with a portion of first side surfaces S1 of the second active patterns. According to example embodiments, the first side surface S1 may be inclined with respect to the upper surface of the substrate 101 or may have a step portion.

In an example embodiment, the second main separation region MS2a_1 may have a first bottom surface BS1, disposed downwardly at a first vertical depth h1 from an upper surface of the second main separation region MS2a_1, and a second bottom surface BS2 disposed downwardly at a second vertical depth h2 from the upper surface of the second main separation region MS2a_1. The second vertical depth h2 may be greater than the first vertical depth h1. The second bottom surface BS2 may be disposed to be lower than the bottom surfaces of the first separation regions MS1.

In an example embodiment, the second main separation region MS2a_1 may have a lower side surface S1 connecting the first bottom surface BS1 and the second bottom surface BS2 disposed at different depths. The lower side surface S1 may be inclined with respect to the upper surface of the substrate 101. Bottom surfaces of the insulating patterns FLD may be disposed on a level between (e.g., in the third direction Z) the first bottom surface BS1 and the second bottom surface BS2. The lower side surface S1 of the second main separation region MS2a_1 may be in contact with the first side surface S1 of the second active patterns 112 and may refer to the same surface.

In an example embodiment, the second main separation region MS2a_1 may have a second side surface S2 extending upwardly of the substrate 101 from the substrate 101 below the insulating patterns FLD. The second side S2 may extend to be longer than the first side surface S1. A second angle formed between the second side surface S2 and the second bottom surface BS2 may be different from a first angle formed between the first side surface S1 and the second bottom surface BS2.

In an example embodiment, a lower portion of the second main separation region MS2a_1, penetrating through the insulating patterns FLD, may have a bent portion. The bent portion may be formed by a difference in heights between the first and second bottom surfaces BS1 and BS2. The bent portion may be formed because a depth of an opening varies in a process of forming a separation region. The variation in the depth of the opening is caused by a shape of the active structures ACT protruding upwardly of the bottom surfaces of the insulating patterns FLD. During an etching process for forming the separation region, the opening may recess the upper portion of the active structure ACT, but may be formed through the insulating patterns FLD.

In an example embodiment, the second main separation region MS2a_2, spaced apart from the second main separation region MS2a_1 to extend again as one in the first direction X, may also have a structure similar to a structure of the above-described second main separation region MS2a_1. For example, the second main separation region MS2a_2 may also have bottom surfaces having different vertical depths from an upper surface thereof, and may have a lower side surface S1 connecting the bottom surfaces to each other.

In this specification, the example structures of the second main separation regions MS2a have been described, but the second auxiliary separation regions MS2b may also have bottom surfaces having different vertical depths in a region in which the second auxiliary separation regions MS2b are spaced apart from each other in the first direction X, as described above. For example, at least one of the second separation regions MS2a and MS2b may have the same or similar structure as described above.

Figure 4B:
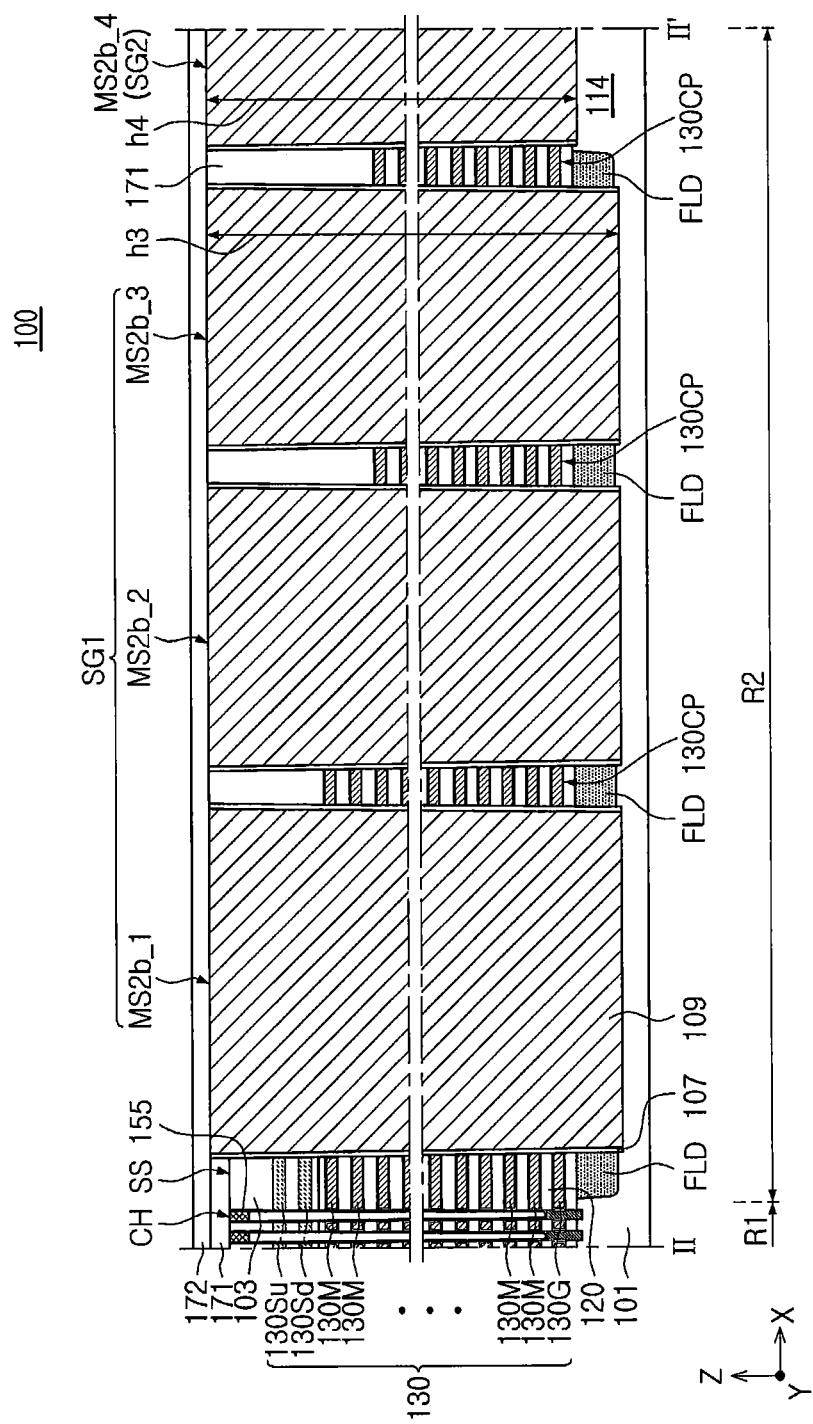

Referring to FIGS. 3B and 4B, the second auxiliary separation regions MS2b may include a first separation group SG1, including three second auxiliary separation regions MS2b_1, MS2b_2, and MS2b_3 sequentially disposed adjacent to the first region R1, and a second separation group SG2 including second auxiliary separation regions MS2b_4 spaced apart from the first separation group SG1. The number of the second auxiliary separation regions MS2b, constituting each of the first and second separation groups SG1 and SG2, is not limited to that described in the drawings. The first separation group SG1 may be more adjacent to the first region R1 than the second separation group SG2. The first and second separation groups SG1 and SG2 may be arranged in the first direction X.

The second auxiliary separation regions MS2b_1, MS2b_2, and MS2b_3 of the first isolation group SG1 may be in contact with the substrate 101. In some embodiments, the second auxiliary separation regions MS2b_1, MS2b_2, and MS2b_3 of the first isolation group SG1 may extend through the insulating patterns FLD to contact the substrate 101. The second auxiliary separation regions MS2b_4 of the second isolation group SG2 may be in contact with fourth active patterns 114. Lower ends of the second auxiliary separation regions MS2b_1, MS2b_2, and MS2b_3 of the first separation group SG1 may be disposed to be lower than lower ends of the second auxiliary separation regions MS2b_4 of the second separation group SG2. Lower ends of the second auxiliary separation regions MS2b_1, MS2b_2, and MS2b_3 of the first isolation group SG1 may be disposed to be lower than lower ends of the first separation regions MS1. Vertical depths h3 of the second auxiliary separation regions MS2b_1, MS2b_2, and MS2b_3 of the first separation group SG1 are greater than vertical depths h4 of the second auxiliary separation regions MS2b_4 of the second separation group SG2.

Figure 4C:
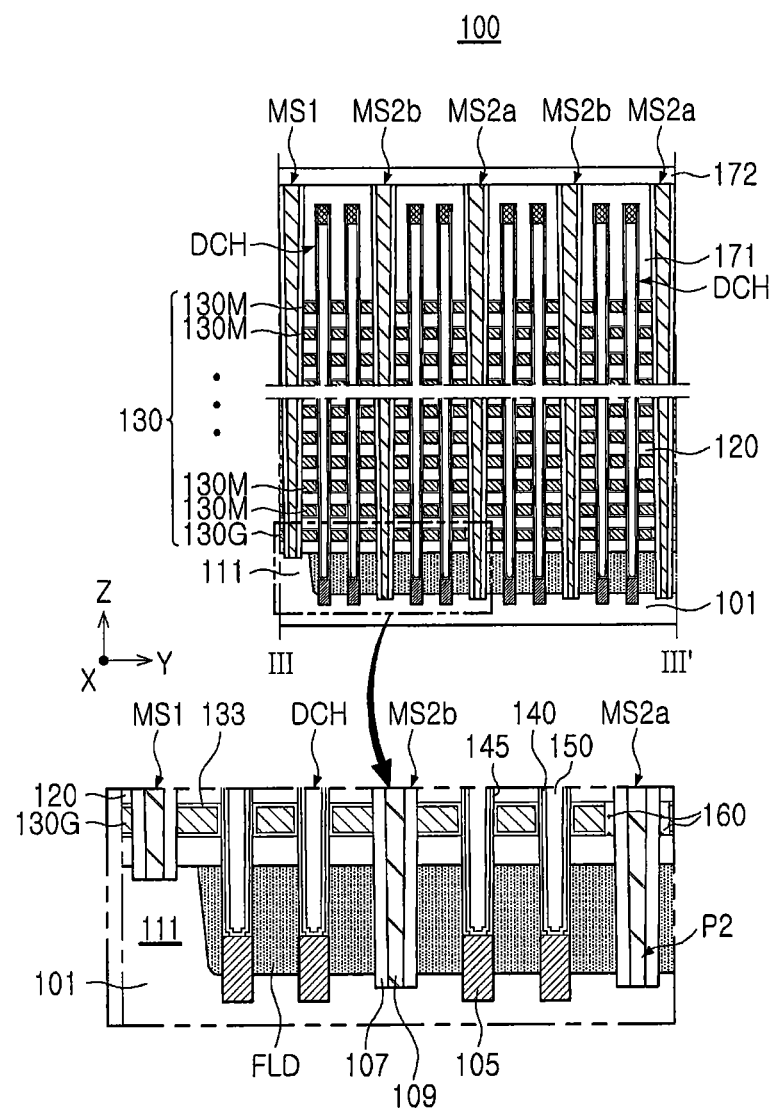
Figure 4D:
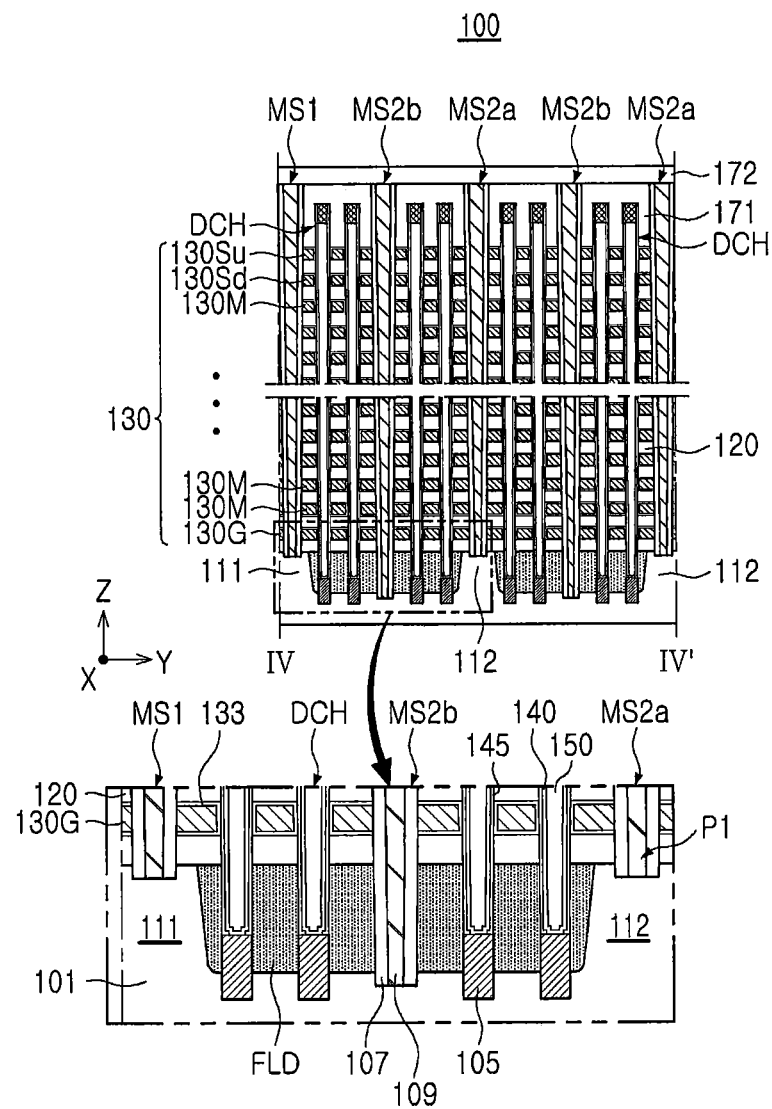

Referring to FIGS. 3B, 4C, and 4D, in at least one cross section in the second direction Y, lower ends of the second main separation regions MS2a and the second auxiliary separation regions MS2b may be disposed to be lower than the lower ends of the first separation regions MS1. A lower insulating layer 160, constituting the lower separation region GS, may be disposed on the insulating patterns FLD to overlap the insulating patterns FLD in the third direction Z.

In at least one cross section in the second direction Y, the second main separation regions MS2a and the second auxiliary separation regions MS2b may be in contact with the substrate 101. In some embodiments, the second main separation regions MS2a and the second auxiliary separation regions MS2b may extend through the insulating patterns FLD to contact the substrate 101. The first separation regions MS1 may be in contact with the first active patterns 111.

Referring to FIGS. 3B, 4C, and 4D, in at least one cross section in the second direction Y, lower ends of the second auxiliary separation regions MS2b may be disposed to be lower than lower ends of the first separation regions MS1 and lower ends of the second main separation regions MS2a. In at least one cross section in the second direction Y, the second portion P2 of the second main separation regions MS2a may be in contact with the substrate 101. In some embodiments, the second portion P2 of the second main separation regions MS2a may extend through the insulating patterns FLD to contact the substrate 101.

In at least one cross section in the second direction Y, the first portion P1 of the second main separation regions MS2a may be in contact with the second active patterns 112 and the second auxiliary separation regions MS2b may be in contact with the substrate 101. In some embodiments, the second auxiliary separation regions MS2b may extend through the insulating patterns FLD to contact the substrate 101.

As illustrated in FIGS. 3A to 4D, the first and second separation regions MS1, MS2a, and MS2b may include a conductive layer 109 and a separation insulating layer 107 covering side surfaces of the conductive layer 109. The conductive layer 109 may be formed of a conductive material, and the separation insulating layer 107 may be formed of an insulating material. The conductive layer 109 may be spaced apart from the gate electrodes 130 by the separation insulating layer 107. The conductive layer 109 of the first isolation regions MS1 may be in direct contact with the substrate 101, and the conductive layer 109 of the second main separation regions MS2a may be in direct contact with the second active patterns 112 or may be in direct contact with the substrate 101 (e.g., through the insulating patterns FLD). The first separation regions MS1 may include the common source line CSL described with reference to FIG. 2, and the second separation regions MS2a and MS2b may include a dummy common source line. In this case, the dummy common source line may enter a floating state in which the dummy common source line is not connected to elements driving the semiconductor device 100 or an electrical signal is not applied.

A poor and/or irregular pattern, in which ends of each of the second isolation regions MS2a and MS2b are bent or protrudes in the second direction Y, may be formed in a region in which the second separation regions MS2a and MS2b are spaced apart from each other in the first direction X. However, the insulating patterns FLD may be formed as illustrated in FIG. 3C to reduce deterioration in characteristics of a semiconductor device caused by the poor and/or irregular pattern.

In the first region R1, the upper separation regions SS may extend between the first separation regions MS1 and the second main separation region MS2a in the first direction X. The upper separation regions SS may be disposed in parallel to the second auxiliary separation region MS2b, and may be in contact with an end of the second secondary separation region MS2b. The upper separation regions SS may be disposed to penetrate through a portion of the gate electrodes 130 including the string selection gate electrodes 130Su and 130Sd, among the gate electrodes 130.

The upper separation regions SS may include the upper insulating layer 103. As illustrated in FIGS. 4A, 4C, and 4D, the upper insulating layer 103 may include the string selection gate electrodes 130Su and 130Sd to separate two gate electrodes 130 from each other in the second direction Y. However, the number of gate electrodes 130 separated by the upper insulating layer 103 may be changed according to example embodiments.

The lower separation region GS may be disposed on the same level as a lowermost ground selection gate electrode 130G. The lower separation region GS may be disposed adjacent to a region in which the second main separation regions MS2a are spaced apart from each other. The lower separation region GS may overlap the insulating patterns FLD in the third direction Z. The lower separation region GS may overlap the second main separation regions MS2a in the third direction Z. The lower separation regions GS may include regions, in which the second main separation regions MS2a are spaced apart from each other, and may be disposed to connect the second main separation regions MS2a to each other.

As illustrated in FIG. 4A, the lower separation region GS may include the lower insulating layer 160. The lower insulating layer 160 may be formed of, for example, a silicon oxide and may include the same material as the interlayer insulating layer 120. The lower insulating layer 160 may be connected to the interlayer insulating layer 120 to constitute a single layer. A boundary between the lower insulating layer 160 and the interlayer insulating layer 120 may or may not be observed. The second main separation region MS2a may penetrate through a portion of the lower insulating layer 160 of the lower separation region GS.

The contact plugs MC may penetrate through a portion of the first and second capping insulating layers 171 and 172 from above in the second region R2, and may be connected to uppermost gate electrodes 130 among the gate electrodes 130 constituting a pad region, respectively. The contact plugs MC may be connected to interconnection lines in a portion disposed thereabove. The contact plugs MC may electrically connect the gate electrodes 130 to circuit elements in a peripheral circuit region. The disposition location, number, and shape of the contact plugs MC may be variously changed. The contact plugs MC may include a conductive material, and may include, for example, tungsten (W), copper (Cu), aluminum (Al), or the like. The contact plugs MC may further include a barrier metal layer.

The first and second capping insulating layers 171 and 172 may be disposed to cover a stacked structure of the substrate 101 and the gate electrodes 130. In an example embodiment, the first and second capping insulating layers 171 and 172 may include a plurality of insulating layers. The first and second capping insulating layers 171 and 172 may include an insulating material such as a silicon oxide or a silicon nitride.

Figure 5A:
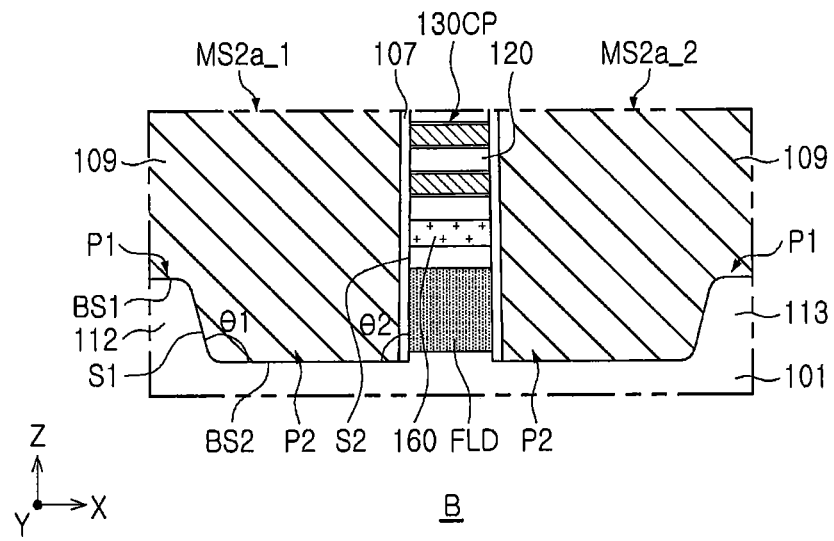
FIGS. 5A to 5D are partially enlarged cross-sectional views of a semiconductor device according to example embodiments of the present disclosure.
Figure 5B:
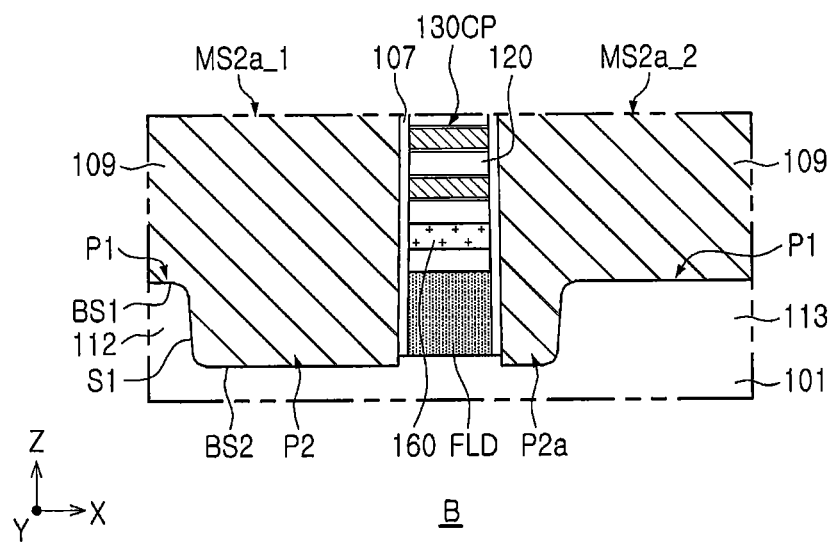
Figure 5C:
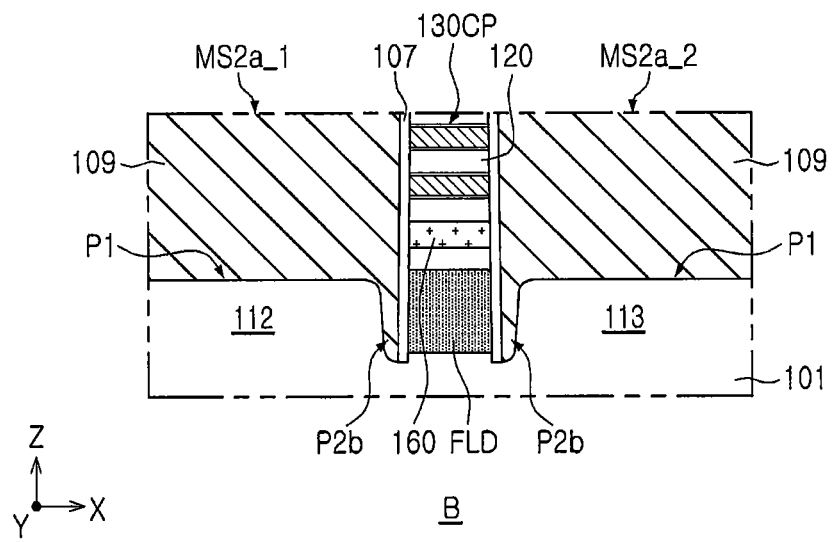
Figure 5D:
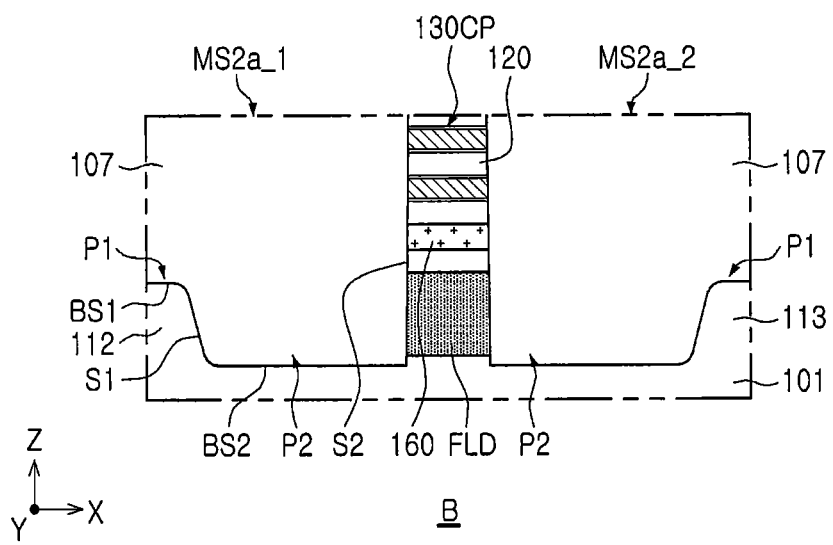

FIGS. 5A to 5D are partially enlarged cross-sectional views of a semiconductor device according to example embodiments of the present disclosure. FIGS. 5A and 5D illustrate a region corresponding to portion 'A' in FIG. 4A.

Referring to FIG. 5A, in a second main separation region MS2a_1, a first angle θ1 formed between a first side surface S1 and a second bottom surface BS2 may be greater than a second angle θ2 formed between a second side surface S2 and the second bottom surface BS2. The first side surface S1 may connect a first bottom surface BS1 and the second bottom surface BS2 to each other. The second side surface S2 may extend more steeply from the second bottom surface BS2 than the first side surface S1. The first side surface S1 may extend more gently from the second bottom surface BS2 than the second side surface S2. A bent portion below the second main separation region MS2a_1 may have a more gentle slope than in the example embodiments of FIGS. 3B to 4D.

Referring to FIG. 5B, second main separation regions MS2a_1 and MS2a_2, disposed adjacent to each other and spaced apart from each other, may have an asymmetric structure based on an imaginary centerline of a region in which they are spaced apart from each other. For example, the second main separation region MS2a_1 may have a first portion P1 and a second portion P2, and an area in which a second portion P2a of the second main separation region MS2a_2 is in contact with the substrate 101 through insulating patterns FLD may be relatively small. A width of the second portion P2a in a first direction X may be reduced (e.g., as compared to the second portion P2).

The second main separation regions MS2a_1 and MS2a_2 may include a separation insulating layer 107 and a conductive layer 109, and the conductive layer 109 may extend further downwardly than the separation insulating layer 107 to be in contact with the substrate 101. A lower end of the conductive layer 109 may be disposed to be lower than a lower end of the separation insulating layer 107. A structure of the separation insulating layer 107 and the conductive layer 109 of this embodiment may be formed by conformally forming the separation insulating layer 107 in an opening and then recessing the substrate 101 to be lower than the lower end of the separation insulating layer 107 while recessing a portion of a lower portion of the separation insulating layer 107.

Referring to FIG. 5C, a width of second portions P2b of the second main separation regions MS2a1 and MS2a_2, disposed adjacent to each other and spaced apart from each other, in a first direction X may be decreased (e.g., as compared to the second portion P2 of FIGS. 4A and 5A and/or portion P2a of FIG. 5B). A second distance D2 (as illustrated in FIG. 3C) of a portion of the insulating patterns FLD, by which the second and third active patterns 112 and 113 are spaced apart from each other, in the first direction X may be relatively short. The second and third active patterns 112 and 113 may extend relatively long in the first direction X. An area of a region, in which the insulating patterns FLD and the second main separation regions MS2a_1 and MS2a_2 overlap each other in the third direction Z when viewed in a plan view, may be relatively small.

Referring to FIG. 5D, the second main separation regions MS2a_1 and MS2a_2 may be formed of an insulating material. It will be understood that the second main separation regions MS2a_1 and MS2a_2 are filled with the separation insulating layer 107. The first separation regions MS1 and the second auxiliary separation regions MS2b may also be formed of an insulating material.

Figure 6:
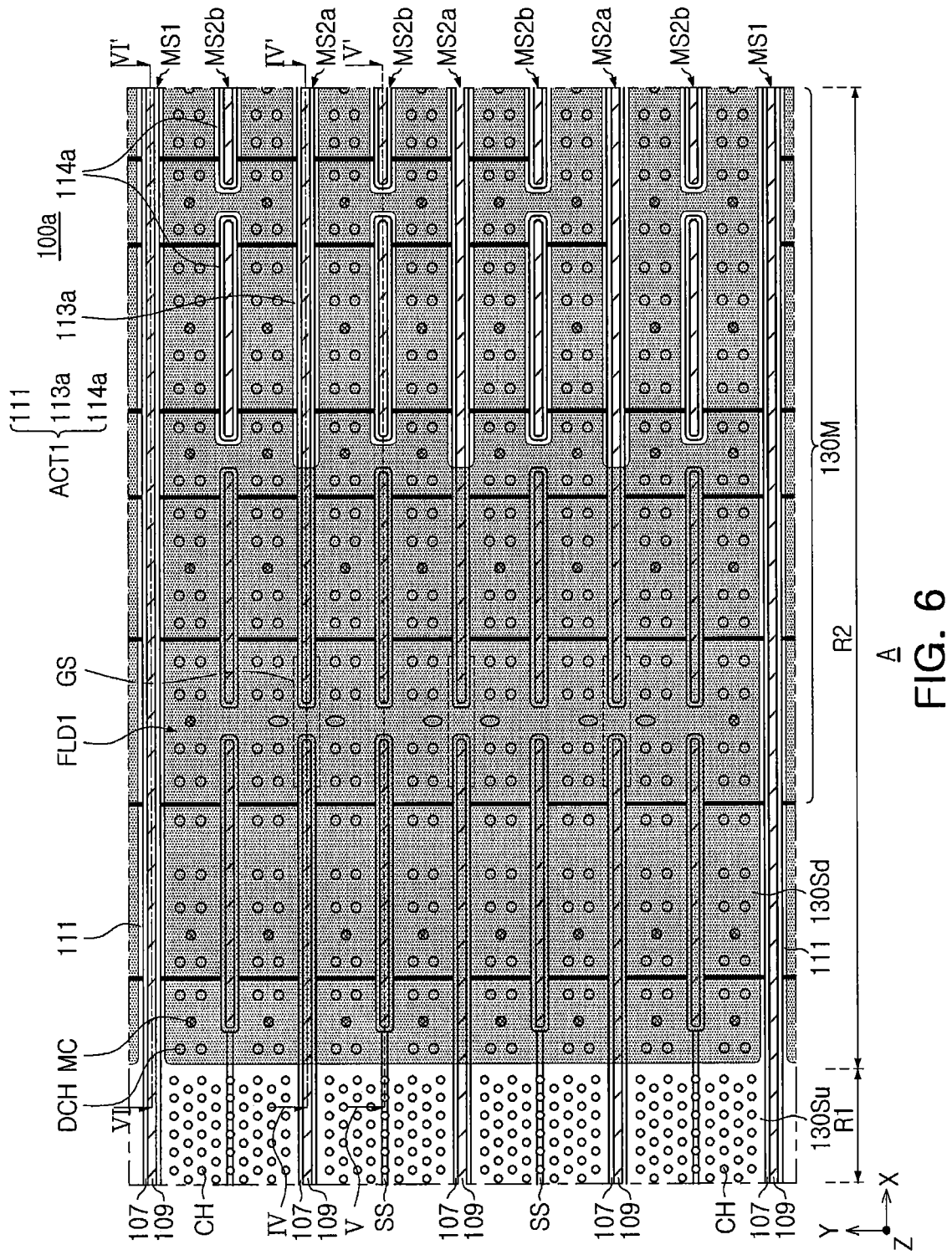
FIG. 6 is a schematic plan view of a semiconductor device according to example embodiments of the present disclosure.

FIG. 6 is a schematic plan view of a semiconductor device according to example embodiments of the present disclosure. FIG. 6 illustrates a region corresponding to portion 'A' in FIG. 3A.

Figure 7A:
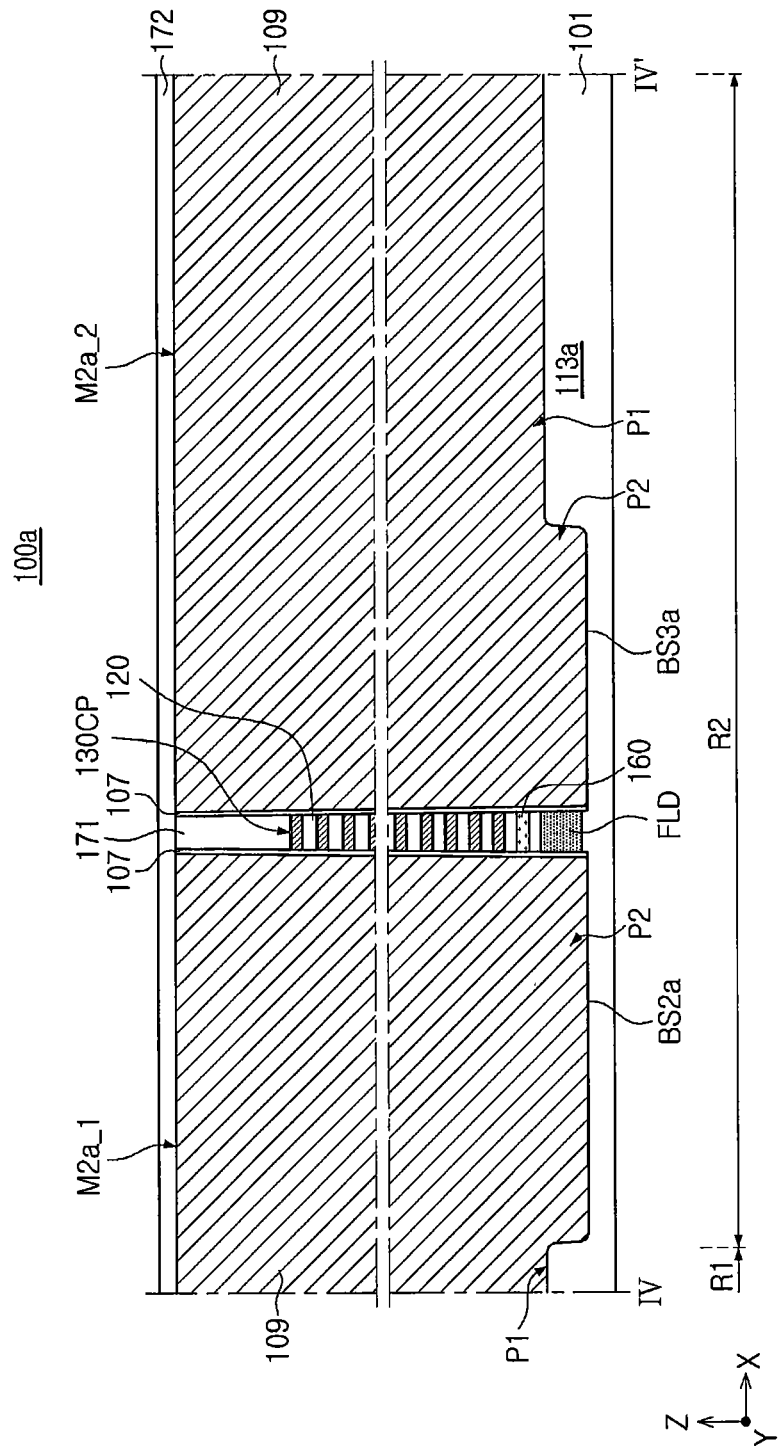
FIGS. 7A to 7C are cross-sectional views of a semiconductor device according to example embodiments of the present disclosure.
Figure 7B:
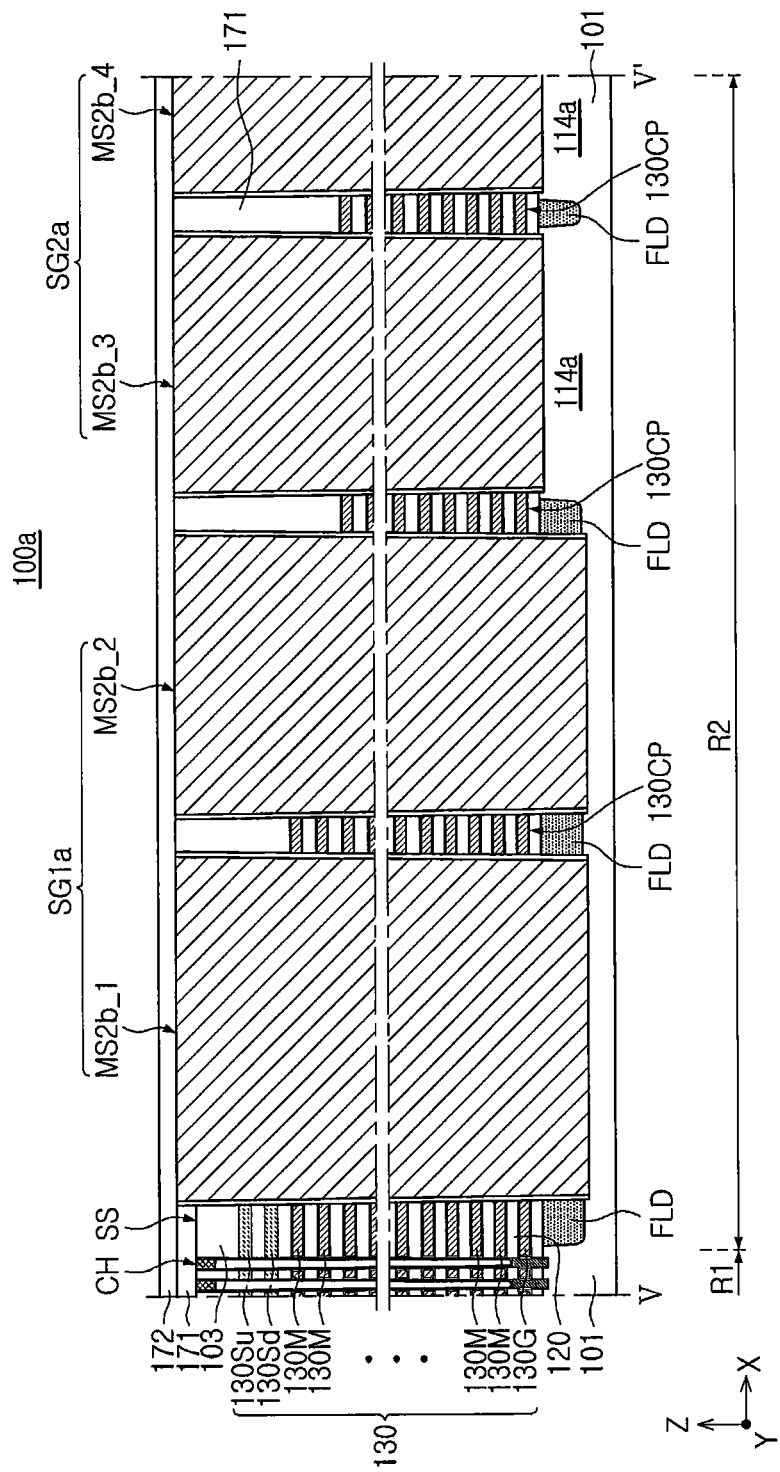
Figure 7C:
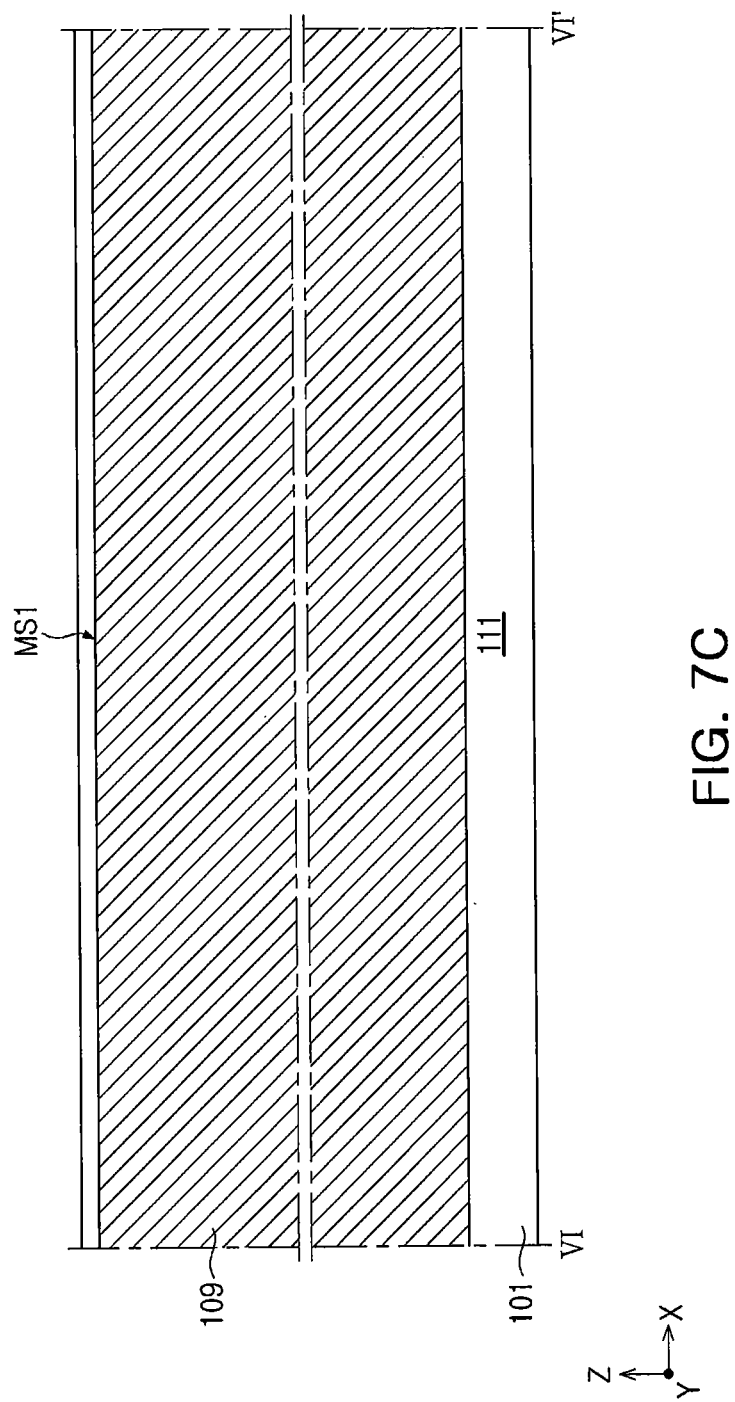

FIGS. 7A to 7C are cross-sectional views of a semiconductor device according to example embodiments of the present disclosure. FIG. 7A to 7C are cross-sectional views taken along lines IV-IV', V-V', and VI-VI' in FIG. 6, respectively.

Referring to FIGS. 6 to 7C, in a semiconductor device 100a, structures of insulating patterns FLD1 and active structures ACT1 may be different from those in the example embodiment of FIGS. 3A to 4D. In the semiconductor device 100a, structures of second main separation regions MS2a and second auxiliary separation regions MS2b may also be partially different due to the insulating patterns FLD1 and the active structure ACT1.

The active structure ACT1 may not include the second active patterns 112 (see FIG. 3C) disposed below a second main separation region MS2a_1. Third active patterns 113a of the active structure ACT1 may extend to a smaller length than in the example embodiment of FIG. 3C. An area, in which third active patterns 113a overlap second main separation regions MS2a in a third direction Z when viewed in a plan view, may be relatively increased. Fourth active patterns 114a of the active structure ACT1 may be disposed to be in contact with lower ends of second auxiliary separation regions MS2b_3 and MS2b_4, as illustrated in FIG. 7B.

An area of a second bottom surface BS2a, on which a second portion P2 of the second main separation region MS2a_1 is in contact with a substrate 101, or a length of the second bottom surface BS2a in a first direction X may be relatively large, as compared with the example embodiment of FIG. 4A. An area of a third bottom surface BS3a, on which a second portion P2 of the second main separation region MS2a_2 is in contact with the substrate 101, or a length of the third bottom surface BS3a in the first direction X may be relatively large, as compared with the example embodiment of FIG. 4A.

The second auxiliary separation regions MS2b may include a first separation group SG1a, including two second auxiliary separation regions MS2b_1 and MS2b_2 sequentially disposed adjacent to the first area R1, and a second separation group SG2a including other second auxiliary separation regions MS2b_3 and MS2b_4 spaced apart from the first separation group SG1a. The second auxiliary separation regions MS2b_1 and MS2b_2 of the first isolation group SG1a may contact the substrate 101. In some embodiments, the second auxiliary separation regions MS2b_1 and MS2b_2 of the first isolation group SG1a may extend through the insulating patterns FLD to contact the substrate 101. The second auxiliary separation regions MS2b_3 and MS2b_4 of the second isolation group SG2a may be in contact with the fourth active patterns 114a. Since the description of comparison of height and vertical depth of lower end of separation regions is similar to that given above, the preceding description will be referred to.

As illustrated in FIG. 7C, first separation regions MS1 extend in a first direction X, and lower ends of the first separation regions MS1 may be in direct contact with the substrate 101. A structure of the first separation regions MS1 may be the same as in other example embodiments, for example, the semiconductor device 100 of FIGS. 3A to 4D.

Figure 8:
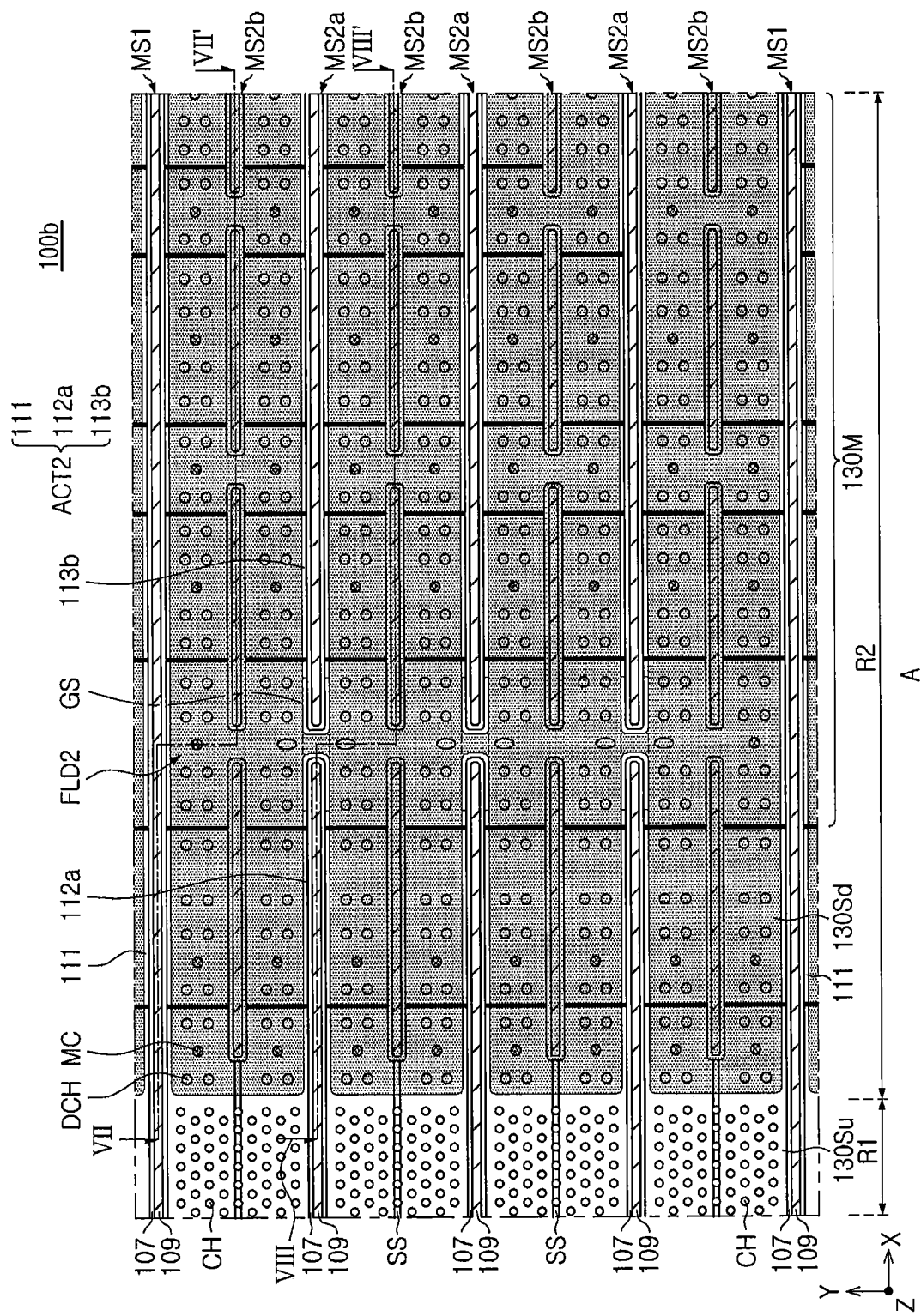
FIG. 8 is a schematic plan view of a semiconductor device according to an example embodiment of the present disclosure.

FIG. 8 is a schematic plan view of a semiconductor device according to an example embodiment of the present disclosure. FIG. 8 illustrates a region corresponding to portion 'A' in FIG. 3A.

Figure 9A:
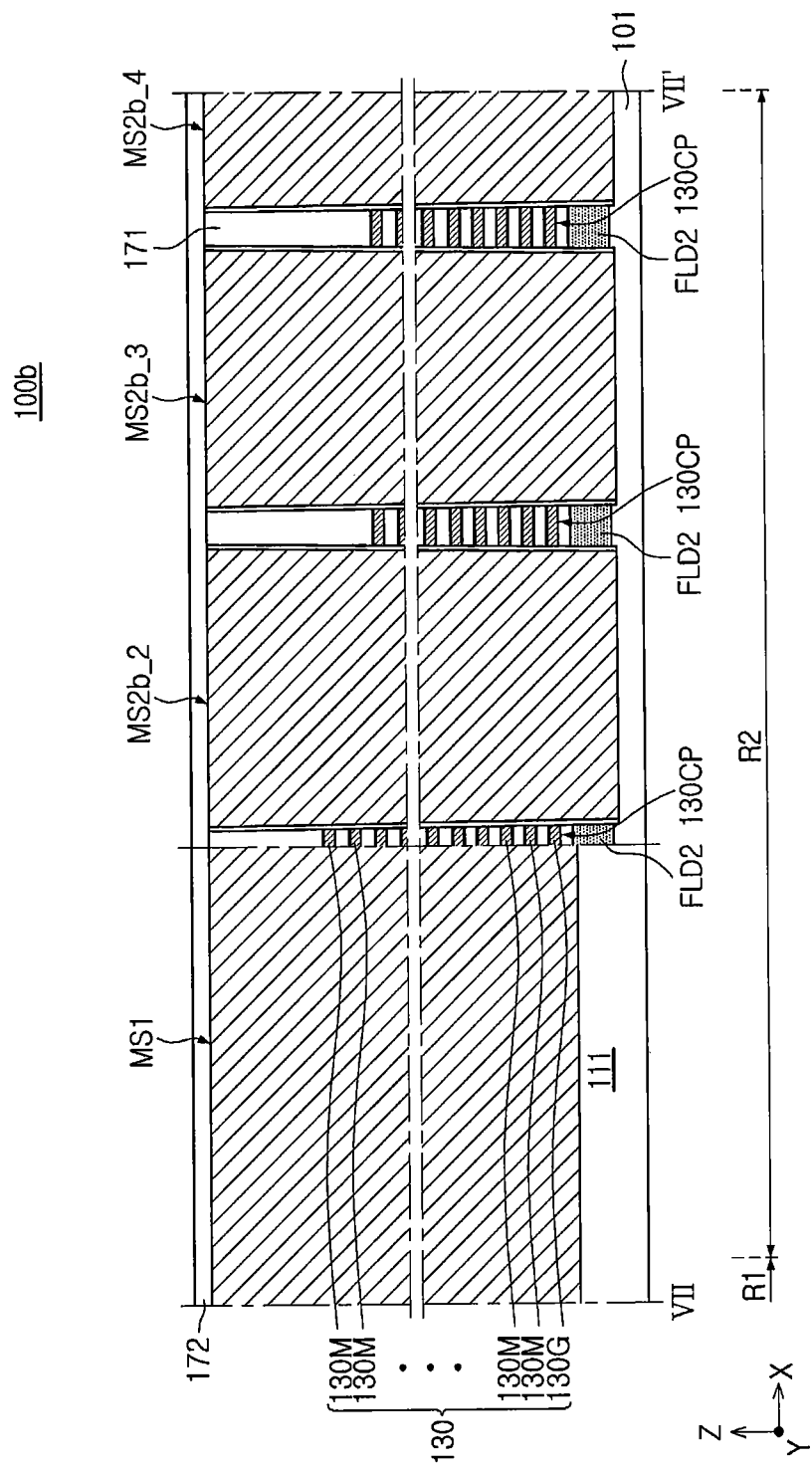
FIGS. 9A and 9B are cross-sectional views of a semiconductor device according to example embodiments of the present disclosure.
Figure 9B:
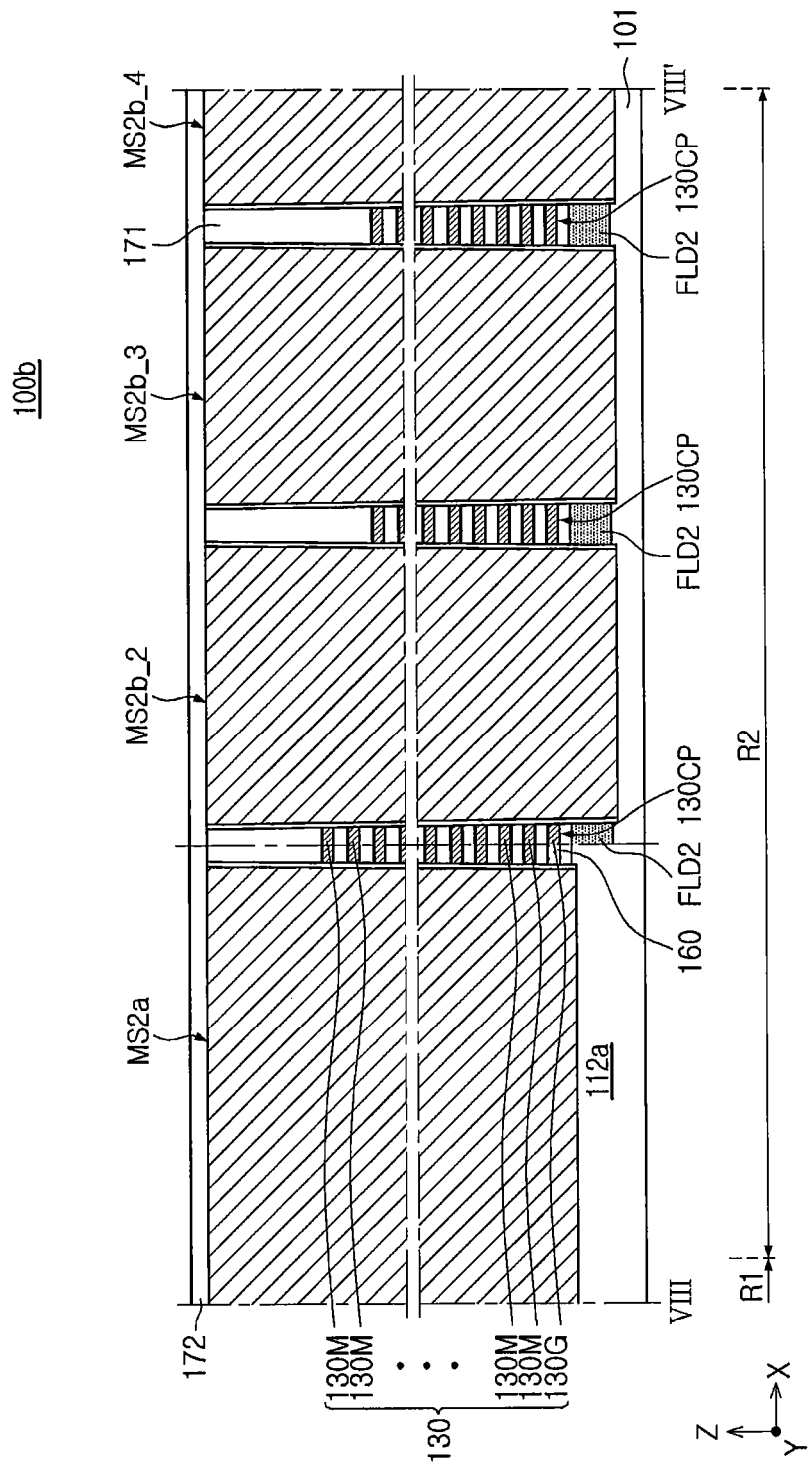

FIGS. 9A and 9B are cross-sectional views of a semiconductor device according to example embodiments of the present disclosure. FIGS. 9A and 9B are cross-sectional views taken along lines WI-VIP and VIII-VIII' in FIG. 8, respectively.

Referring to FIGS. 8 to 9B, in a semiconductor device 100b, structures of insulating patterns FLD2 and active structure ACT2 may be different from those in the example embodiments of FIGS. 3A to 4D. In the semiconductor device 100b, structures of second main separation regions MS2a and second auxiliary separation regions MS2b may also be partially different due to the insulating patterns FLD2 and the active structure ACT2.

The active structure ACT2 may not include fourth active patterns 114 (see FIG. 3C) disposed below a portion of the second auxiliary separation regions MS2b. Second active patterns 112a and third active patterns 113b of the active structure ACT2 may extend by a greater length than in the example embodiment of FIG. 3C. The insulating patterns FLD2 may not be in contact with the second main separation regions MS2a. In some embodiments, the insulating patterns FLD2 may be in contact with at least one and/or all of the second auxiliary separation regions MS2b.

Unlike the embodiment of FIG. 4A, second main separation regions MS2a may not have bottom surfaces having different vertical depths. Lower portions of the second main separation regions MS2a may have no bent portion.

Referring to FIGS. 9A and 9B, the lower ends of the second auxiliary separation regions MS2b may be disposed to be lower than lower ends of first separation regions MS1 and lower ends of the second main separation regions MS2a.

Figure 10:
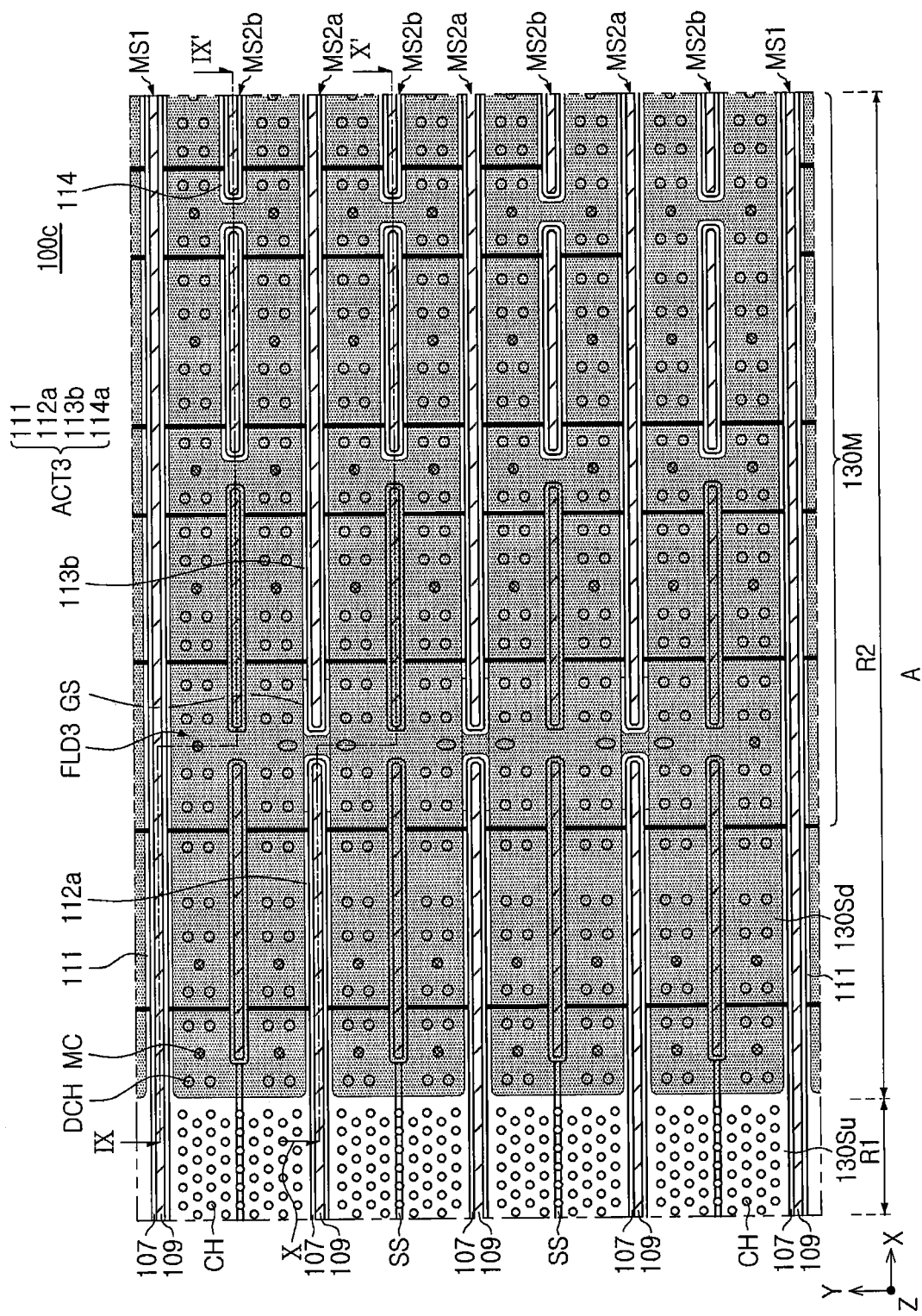
FIG. 10 is a schematic plan view of a semiconductor device according to example embodiments of the present disclosure.

FIG. 10 is a schematic plan view of a semiconductor device according to an example embodiment of the present disclosure. FIG. 10 illustrates a region corresponding to portion 'A' in FIG. 3A.

Figure 11A:
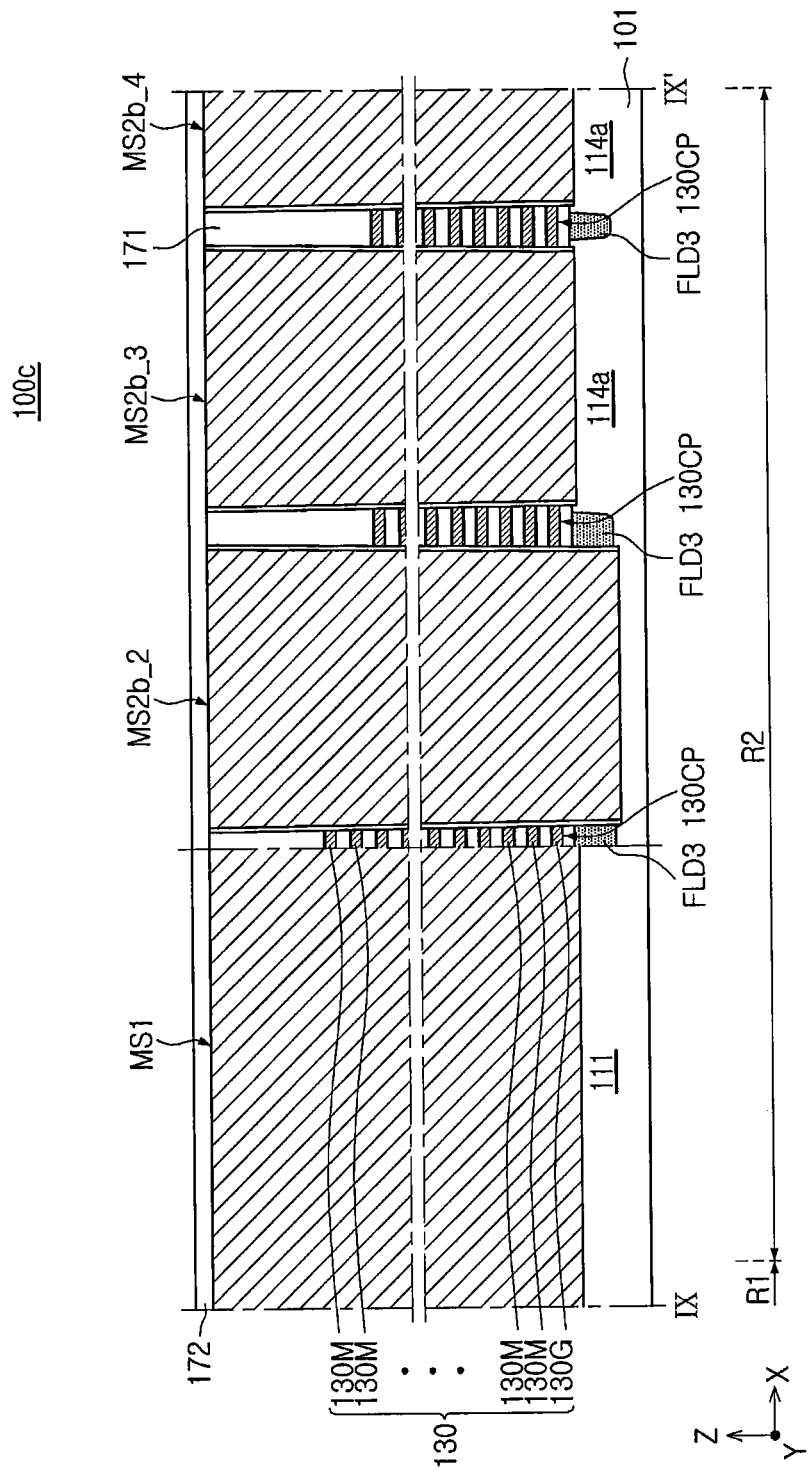
FIGS. 11A and 11B are cross-sectional views of a semiconductor device according to example embodiments of the present disclosure.
Figure 11B:
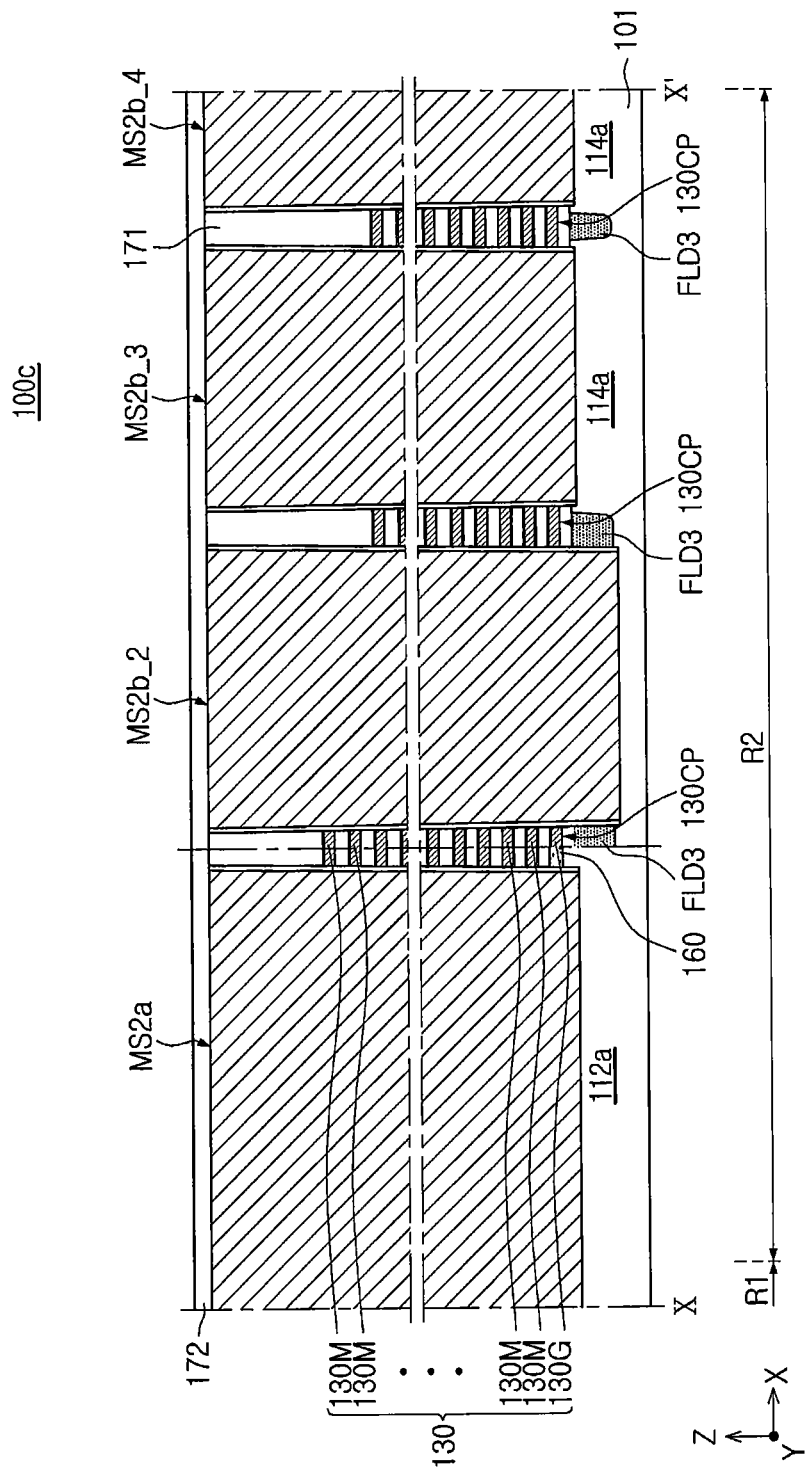

FIGS. 11A and 11B are cross-sectional views of a semiconductor device according to example embodiments of the present disclosure. FIGS. 11A and 11B are cross-sectional views taken along lines IX-IX' and X-X' in FIG. 10, respectively.

Referring to FIGS. 10 to 11B, in a semiconductor device 100c, structures of insulating patterns FLD3 and active structure ACT3 may be different from those in the example embodiments of FIGS. 3A to 4D. In the semiconductor device 100c, structures of second main separation regions MS2a and second auxiliary separation regions MS2b may also be partially different due to the insulating patterns FLD3 and the active structure ACT3.

Second and third active patterns 112a and 113b of the active structure ACT3 may extend for a greater length than in the embodiment of FIG. 3C. In some embodiments, the insulating patterns FLD3 may not be in contact with second main separation regions MS2a. Fourth active patterns 114a of the active structure ACT3 may be disposed to be in contact with lower ends of second auxiliary separation regions MS2b_3 and MS2b_4, as illustrated in FIG. 11B. The insulating patterns FLD3 may be in contact with at least one of the second auxiliary separation regions MS2b in the third direction Z. The second and third active patterns 112a and 113b may be the same as or similar to those described above with reference to FIGS. 8 to 9B, and the fourth active patterns 114a may be the same as or similar to those described above with reference to FIGS. 6 to 7.

Figure 12A:
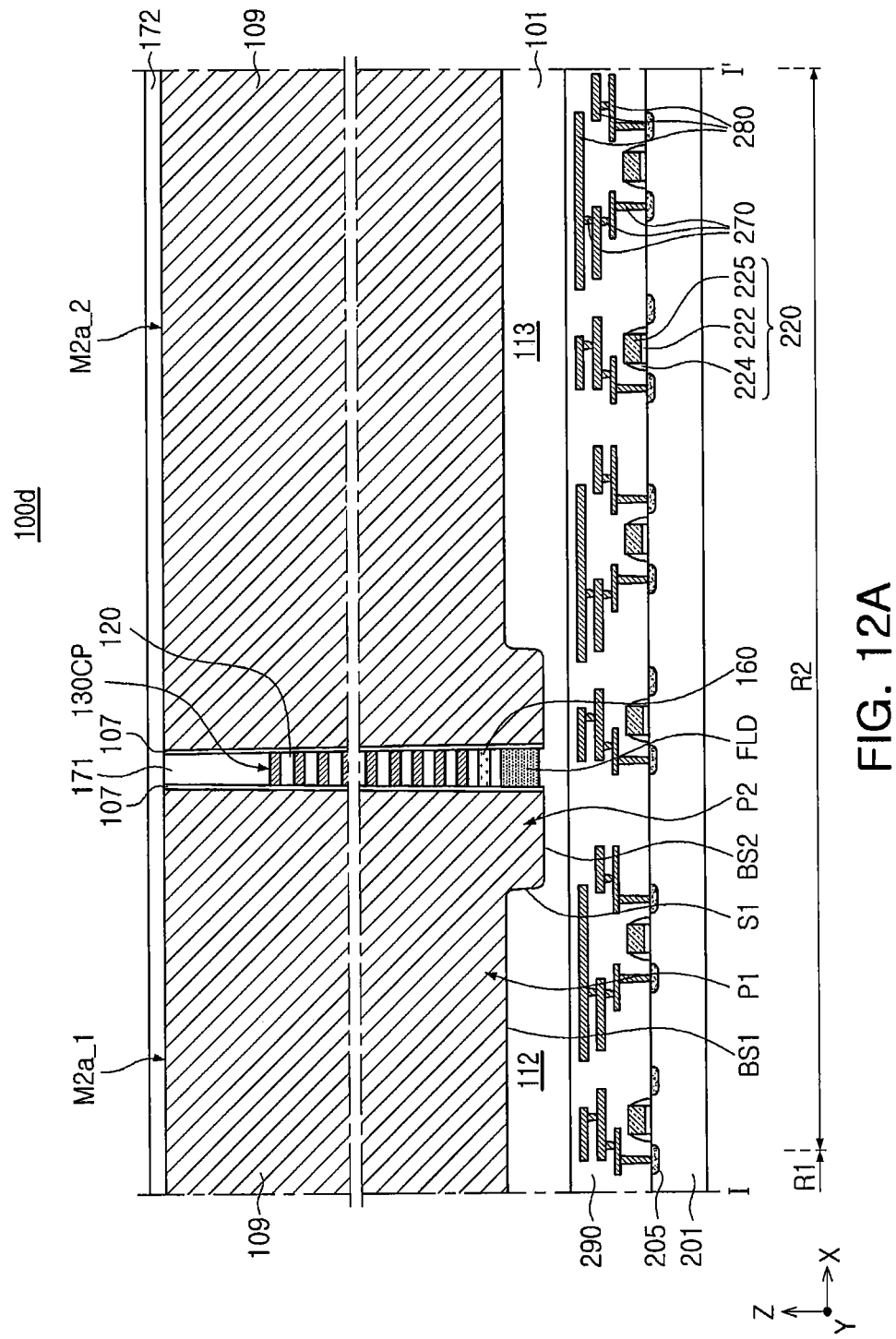
FIGS. 12A and 12B are cross-sectional views of a semiconductor device according to example embodiments of the present disclosure.
Figure 12B:
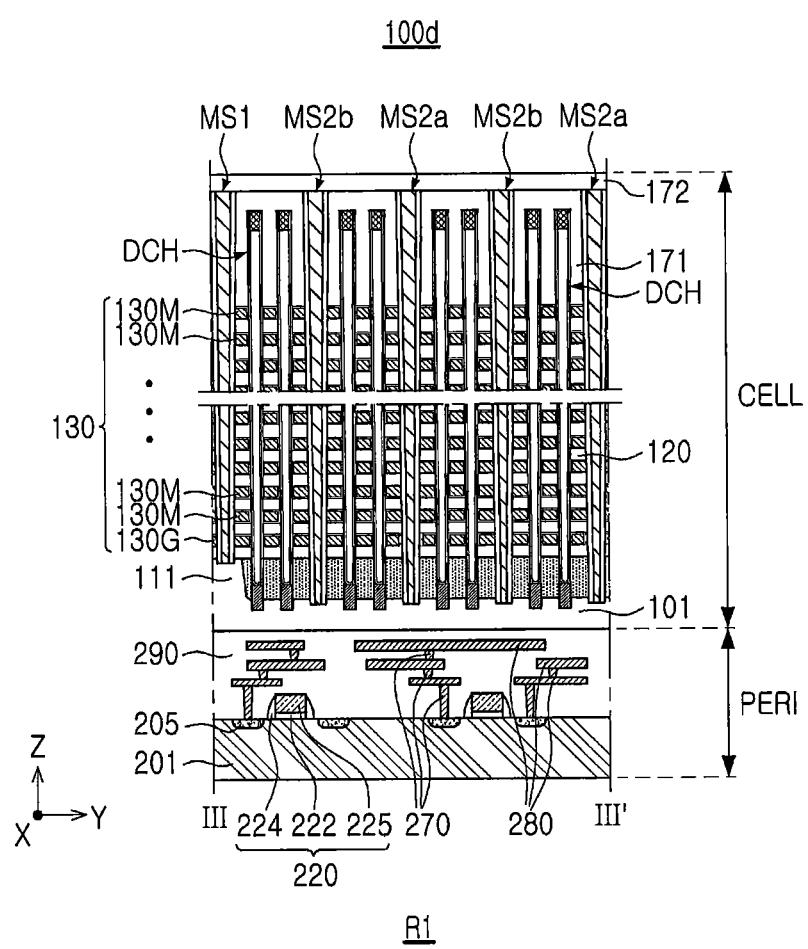

FIGS. 12A and 12B are cross-sectional views of a semiconductor device according to example embodiments of the present disclosure. FIGS. 12A and 12B respectively illustrate a region corresponding to FIGS. 4A and 4C.

Referring to FIGS. 12A and 12B, a semiconductor device 100d may include a memory cell region CELL and a peripheral circuit region PERI. The memory cell region CELL may be disposed above the peripheral circuit region PERI. In an example embodiment, the memory cell region CELL may be disposed below the peripheral circuit region PERI.

As described above with reference to FIGS. 3A to 4D, the memory cell region CELL may include a substrate 101, insulating patterns FLD, interlayer insulating layers 120, and gate electrodes 130, channel structures CH, dummy channel structures DCH, first and second separation regions MS1, MS2a, and MS2b, upper separation region SS, and lower separation region GS. The memory cell region CELL may have a structure according to various embodiments as described above with reference to FIGS. 3A to 11B.

The peripheral circuit region PERI may include a base substrate 201, circuit elements 220 disposed on the base substrate 201, circuit contact plugs 270, and interconnection lines 280.

The base substrate 201 may have an upper surface extending in the first direction X and the second direction Y. In the base substrate 201, additional isolation layers may be formed to define an active region. Source/drain regions 205, including impurities, may be disposed in a portion of the active region. The base substrate 201 may include a semiconductor material such as a group IV semiconductor, a group III-V compound semiconductor, or a group II-VI oxide semiconductor.

Circuit elements 220 may include a planar transistor. Each of the circuit elements 220 may include a circuit gate insulating layer 222, a spacer layer 224, and a circuit gate electrode 225. Source/drain regions 205 may be disposed in the base substrate 201 on opposite sides adjacent to the circuit gate electrode 225.

A peripheral region insulating layer 290 may be disposed on the circuit element 220 above the base substrate 201. The circuit contact plugs 270 may be connected to the source/drain regions 205 through the peripheral region insulating layer 290. An electric signal may be applied to the circuit element 220 by the circuit contact plugs 270. In a region not illustrated, the circuit contact plugs 270 may also be connected to the circuit gate electrode 225. The interconnection lines 280 may be connected to the circuit contact plugs 270 and may be disposed as a plurality of layers. In a region not illustrated, the gate electrodes 130 of the memory cell region CELL may be connected to the circuit elements 220 of the peripheral circuit region PERI through an additional through-region, penetrating through the peripheral circuit region PERI, and a through-via in the through-region.

Figure 13A:
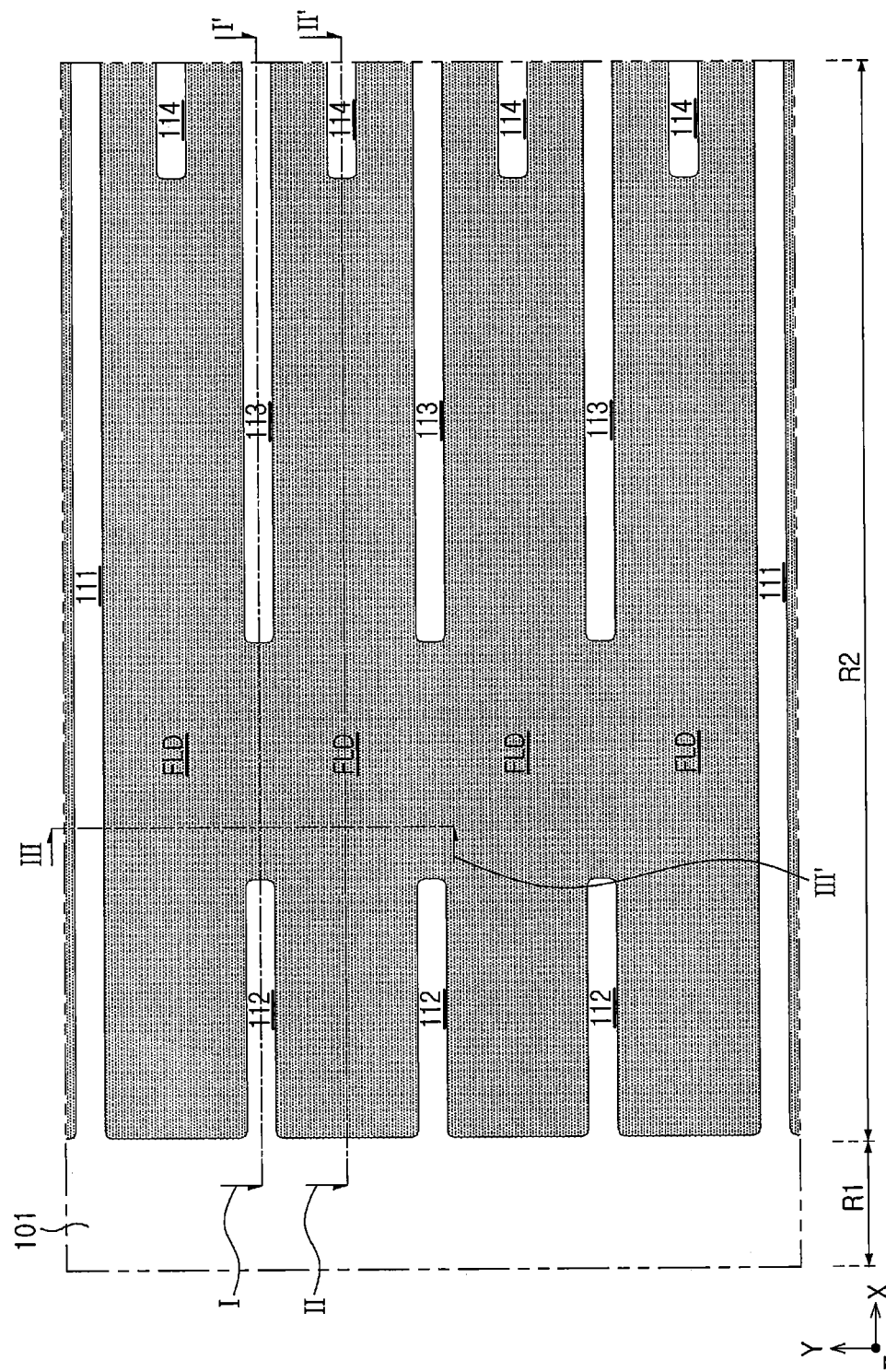
FIGS. 13A to 17C are schematic plan views and cross-sectional views illustrating a method of manufacturing a semiconductor device according to example embodiments of the present disclosure.
Figure 13B:
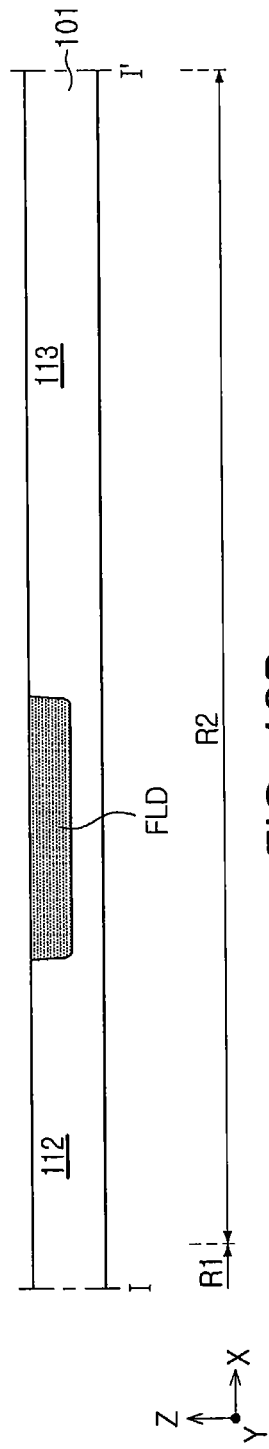
Figure 13C:
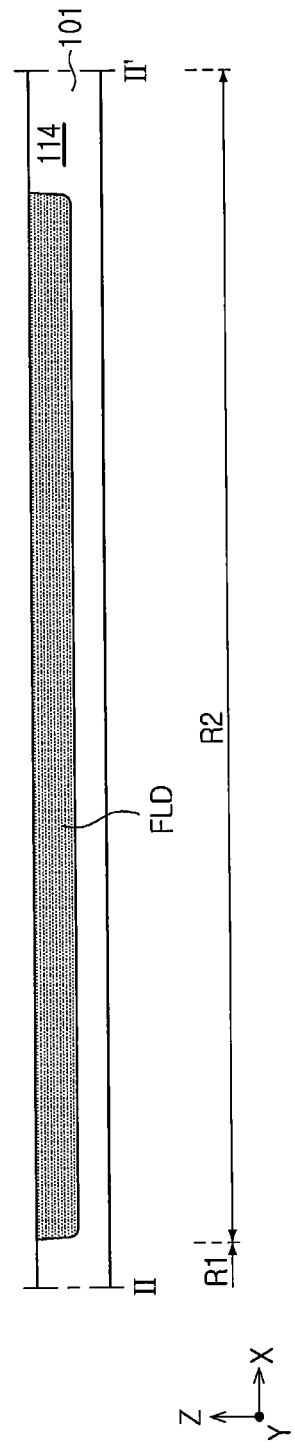
Figure 13D:
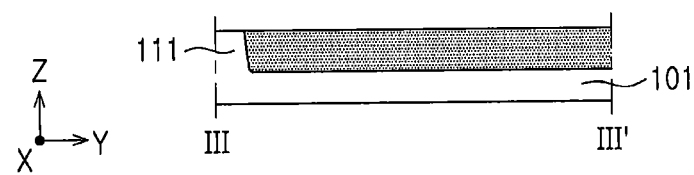
Figure 16A:
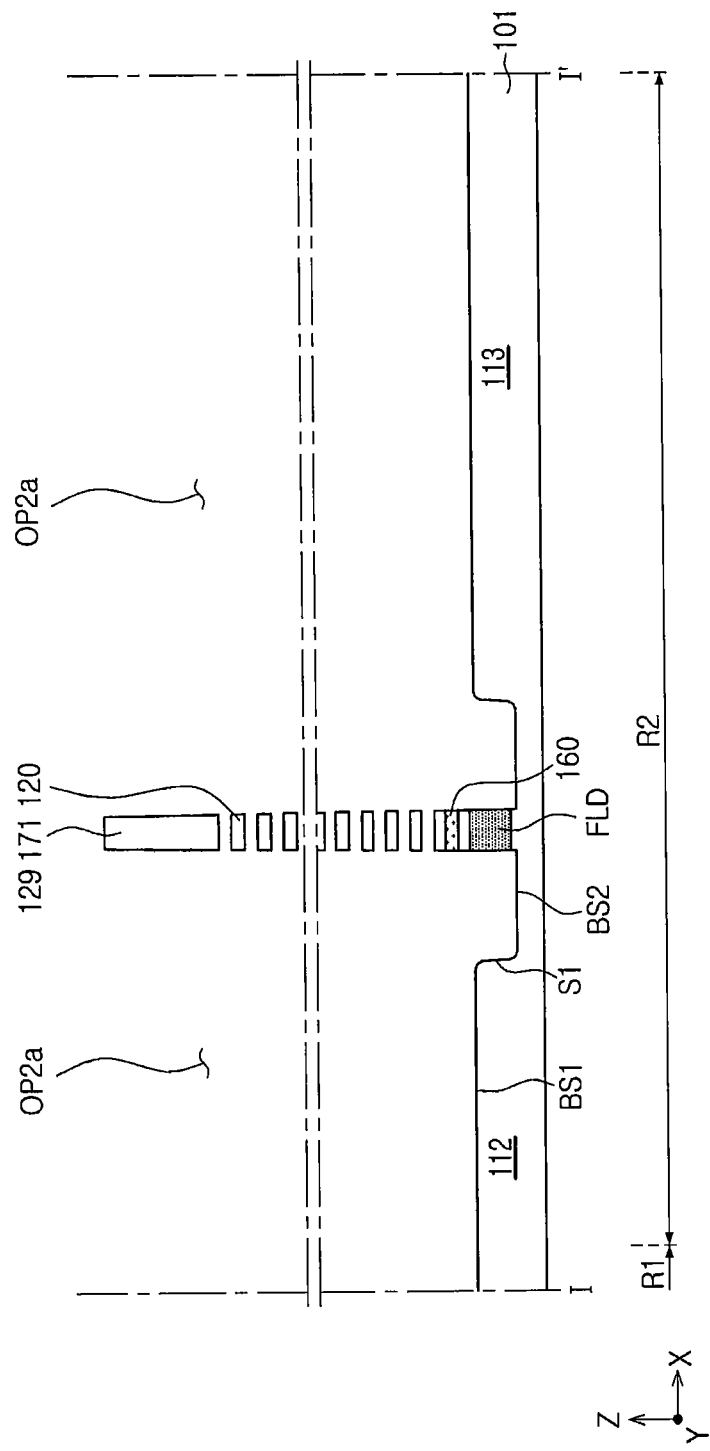
Figure 16B:
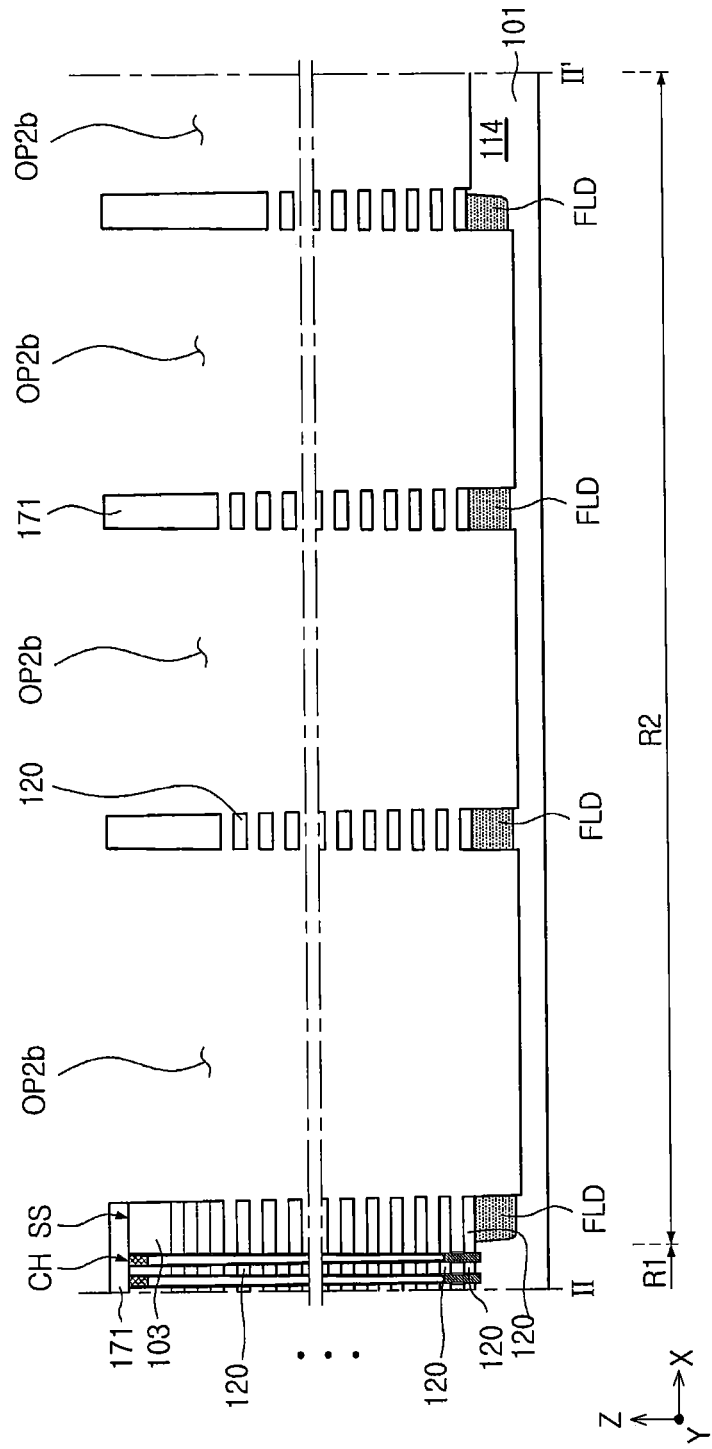
Figure 16C:
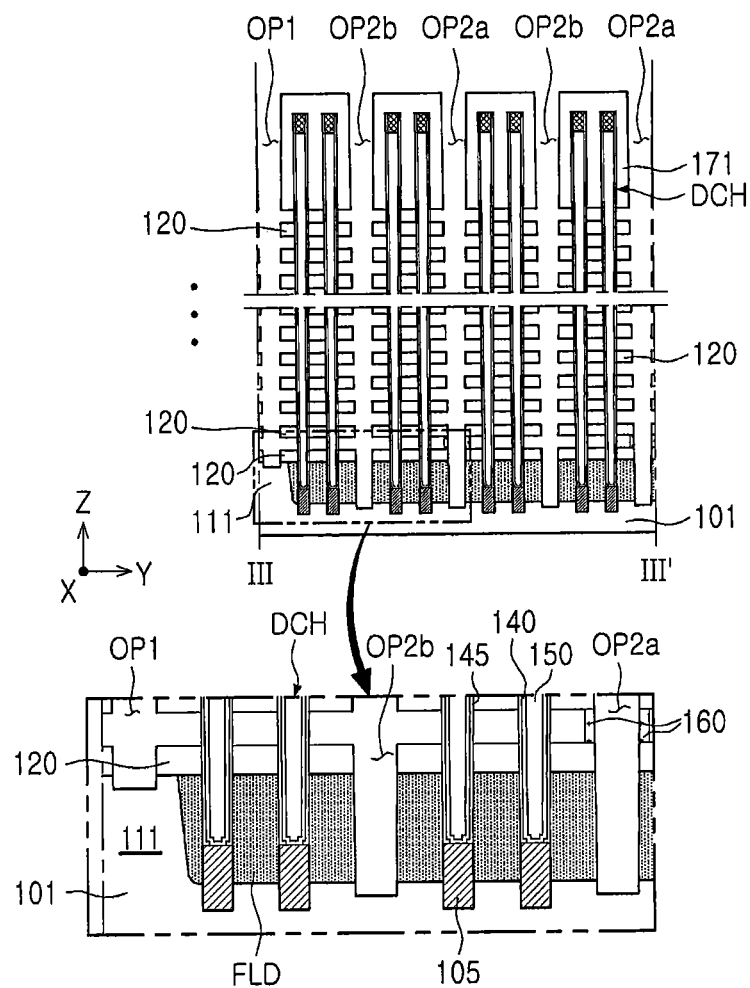
Figure 17A:
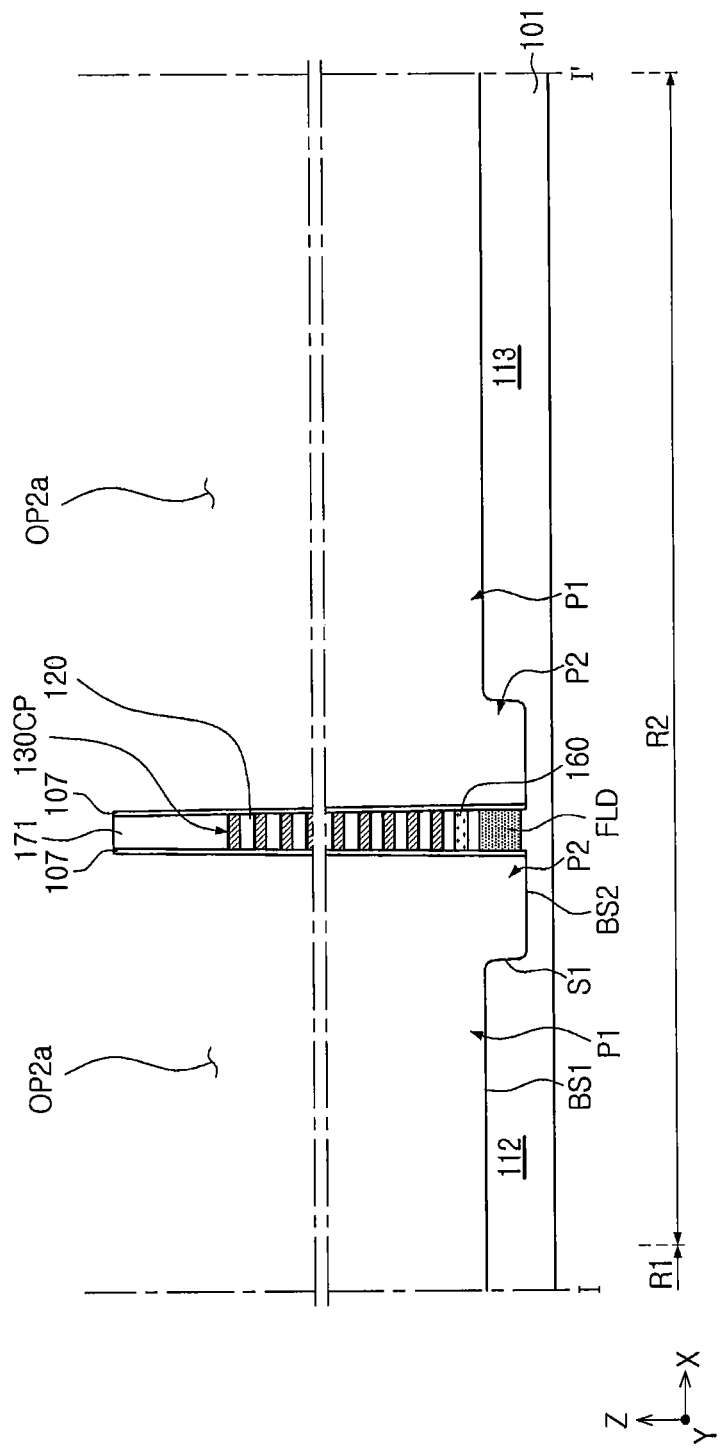
Figure 17B:
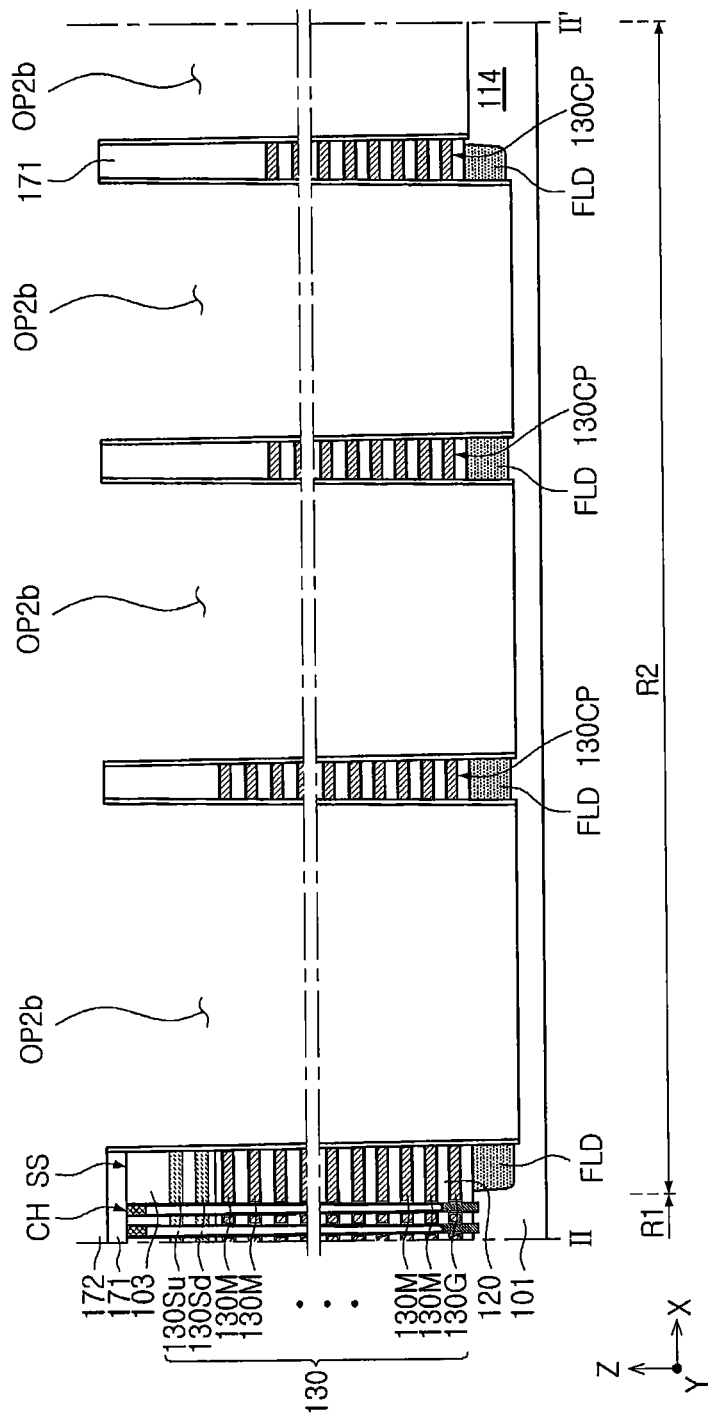
Figure 17C:
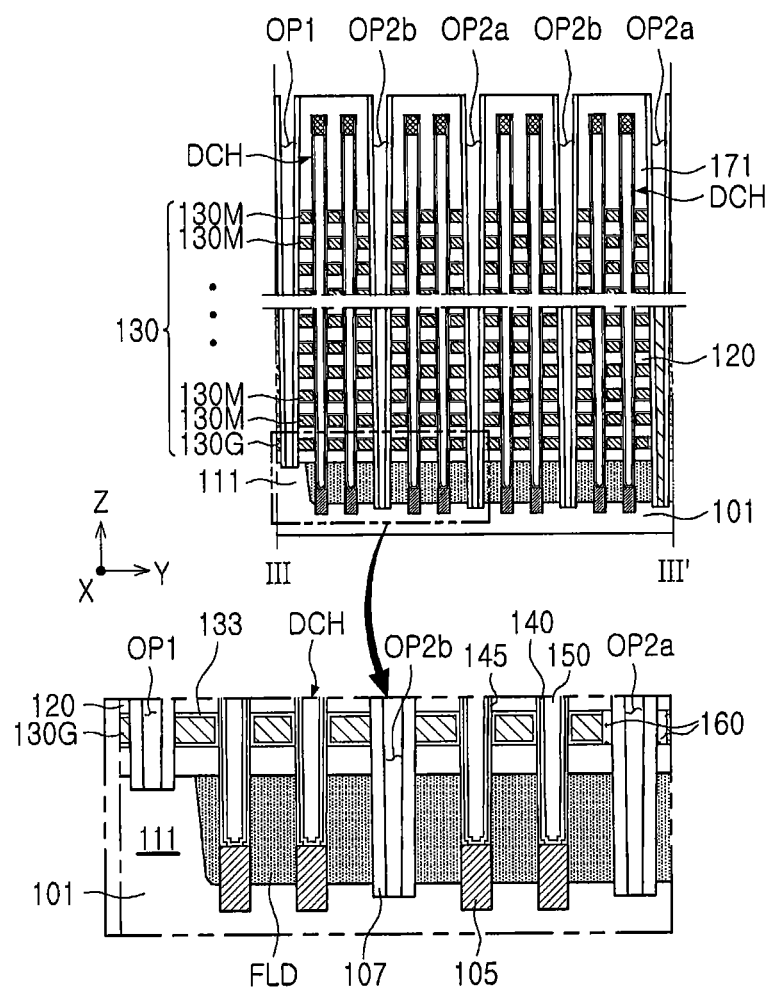

FIGS. 13A to 17C are schematic plan views and cross-sectional views illustrating a method of manufacturing a semiconductor device according to example embodiments of the present disclosure. FIGS. 13A, 14A, and 15A are partially enlarged plan views corresponding to portion 'A' in FIG. 3A. FIGS. 13B, 14B, and 15B are cross-sectional views taken along line I-I' in FIGS. 13A, 14A, 15A, respectively. FIGS. 13C, 14C, and 15C are cross-sectional views taken along line II-II' in FIGS. 13A, 14A, and 15A respectively. FIGS. 13D, 14D, and 15D are cross-sectional views taken along line in FIGS. 13A, 14A, and 15A respectively. FIGS. 16A and 17A are cross-sectional views taken along line I-I' in a location corresponding to the same line I-I' in FIGS. 13A, 14A, 15A. FIGS. 16B and 17B are cross-sectional views taken along line in a location corresponding to the same line II-II' in FIGS. 13A, 14A, 15A. FIGS. 16C and 17C are cross-sectional views taken along line in a location corresponding to the same line in FIGS. 13A, 14A, 15A.

Referring to FIGS. 13A to 13D, in a second region R2, insulating patterns FLD may be formed in a substrate 101.

A portion of the substrate 101 may be anisotropically etched to form trench regions. The trench regions may be narrowed in a downward direction by an aspect ratio. The trench regions may be filled with an insulating material, and then a planarization process may be performed along an upper surface of the substrate 101.

Insulating patterns FLD may be formed to have a predetermined pattern in the second region R2. The insulating patterns FLD may define an active structure ACT of the substrate 101. The active structure ACT may correspond to regions, in which trench regions are not formed in the substrate 101, in the second region R2.

The active structure ACT may be formed to have first to fourth active patterns 111, 112, 113, and 114, as illustrated in FIG. 13A. The first to fourth active patterns 111, 112, 113, and 114 may have a shape protruding upwardly of bottom surfaces of the insulating patterns FLD. The first to fourth active patterns 111, 112, 113, and 114 may be narrowed in an upward direction due to the aspect ratio of the trench regions.

Referring to FIGS. 14A to 14D, sacrificial layers 129 and interlayer insulating layers 120 may be alternately stacked on a substrate 101 to form a preliminary stacked structure PST. Some of the sacrificial layers 129 and the interlayer insulating layers 120 may be removed such that the sacrificial layers 129 extend by different lengths in a first direction X. An upper insulating layer 103 may be formed to penetrate through some of the upper sacrificial layers 129.

The sacrificial layers 129 may be replaced with the gate electrodes 130 through a subsequent process. The sacrificial layers 129 may be formed of a material which may be etched with an etching selectivity with respect to the interlayer insulating layers 120. For example, the interlayer insulating layer 120 may be formed of at least one of a silicon oxide and a silicon nitride, and the sacrificial layers 129 may be formed of a material, selected from silicon, a silicon oxide, a silicon carbide, and a silicon nitride, different from the material of the interlayer insulating layer 120. Thicknesses of the interlayer insulating layers 120 and the sacrificial layers 129 and the number of layers, constituting the interlayer insulating layers 120 and the sacrificial layers 129, may be variously modified from those illustrated.

A photolithography process and an etching process for the sacrificial layers 129 are repeatedly performed on the sacrificial layers 129 such that upper sacrificial layers 129 may extend to be shorter than lower sacrificial layers 129 in the second region R2. Accordingly, the sacrificial layers 129 may have a step shape. According to example embodiments, a material forming the sacrificial layers 129 is additionally deposited in regions, exposed because the sacrificial layers 129 extend to be longer than the upper sacrificial layers 129, such that each of the sacrificial layers 129 may be formed to have a relatively higher thickness on an end portion thereof.

Figure 14A:
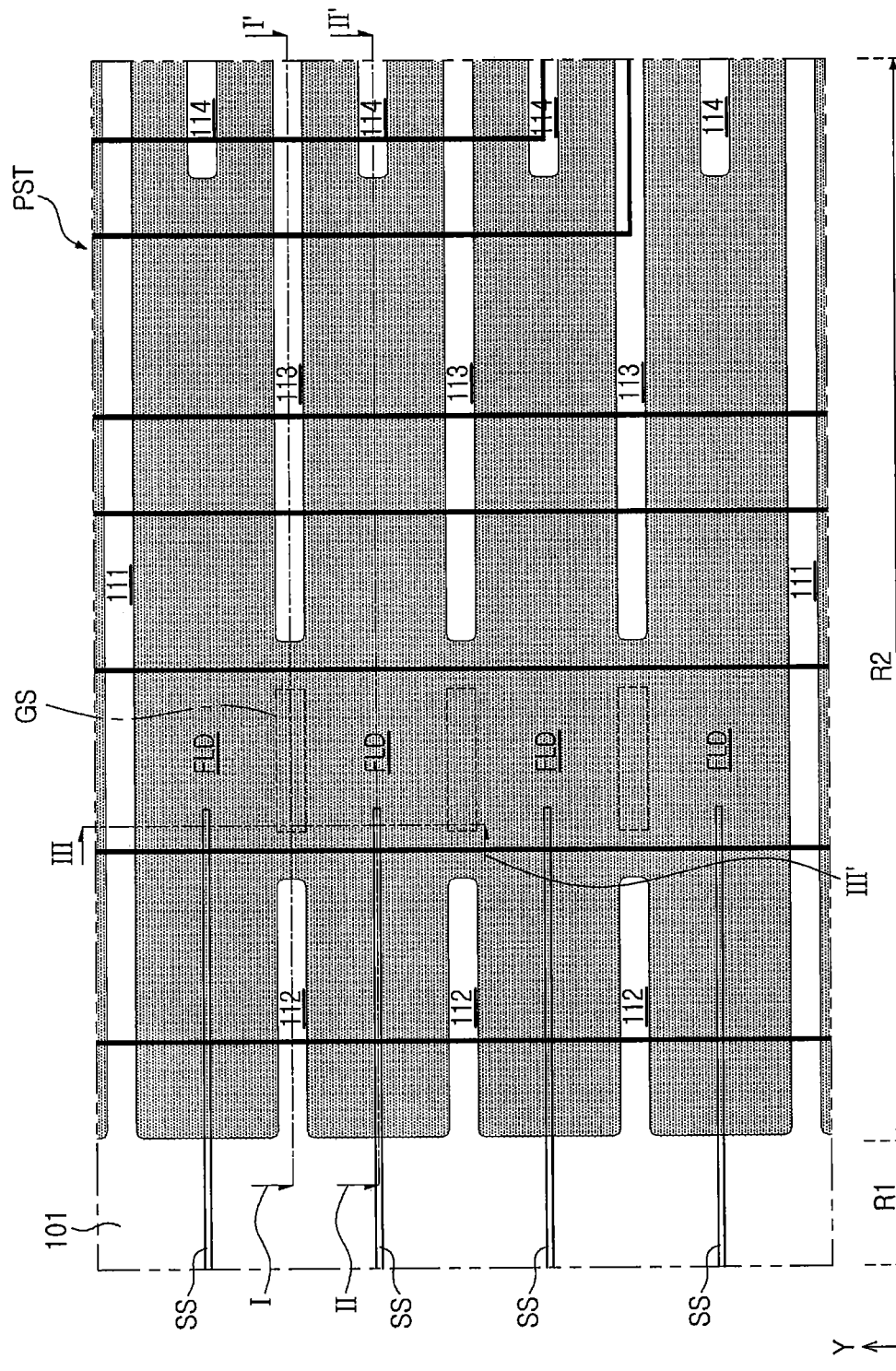
Figure 14B:
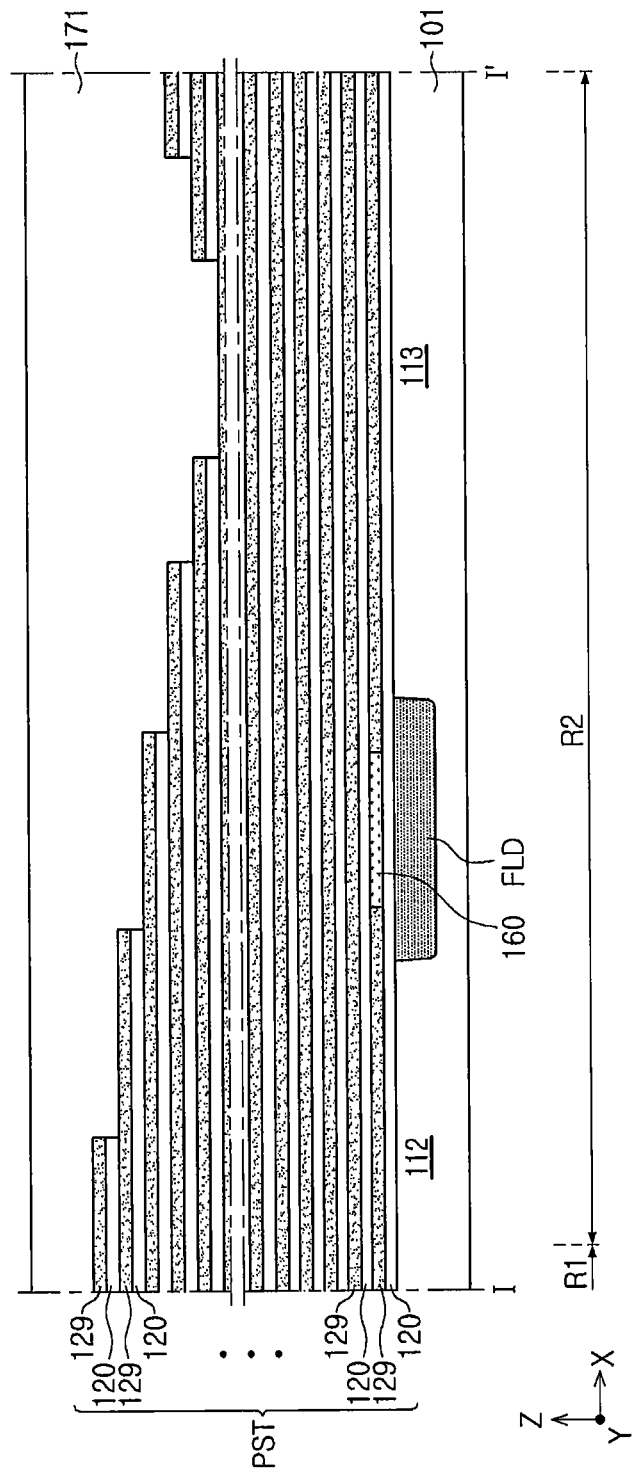
Figure 14C:
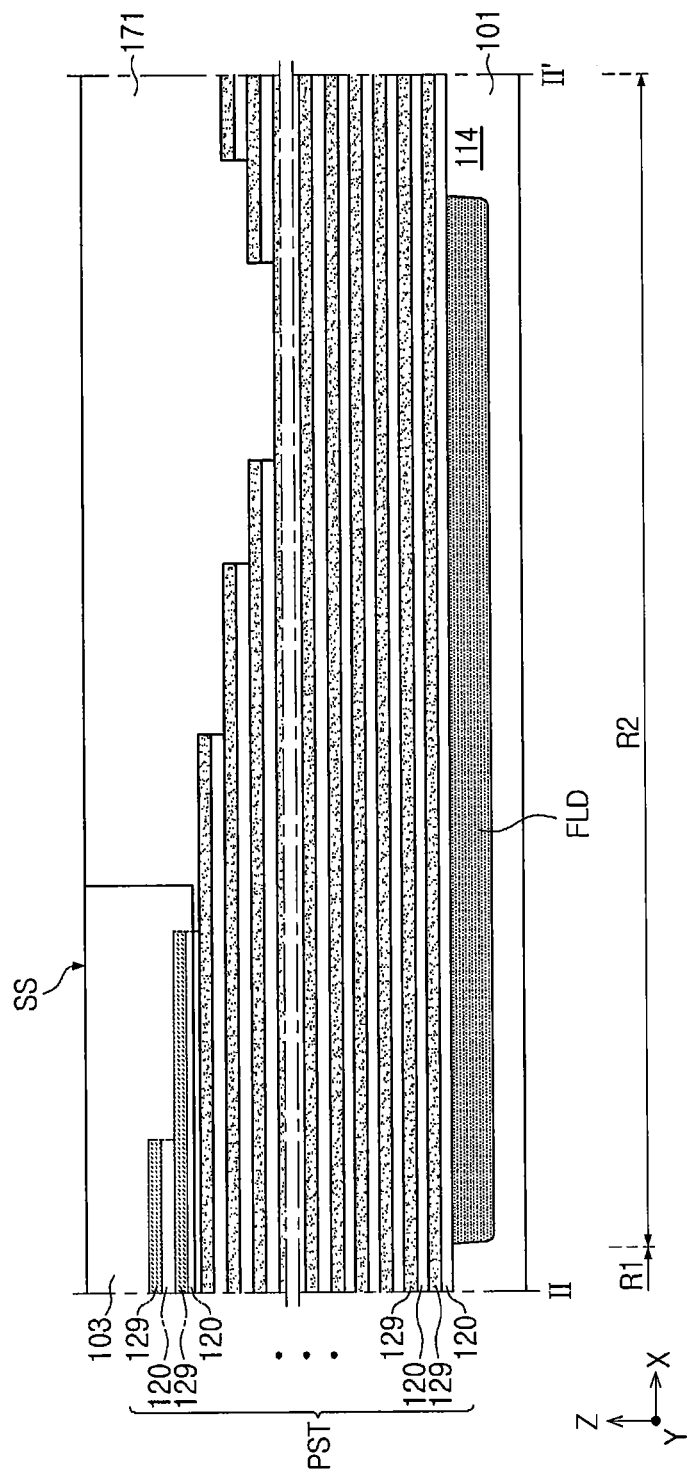
Figure 14D:
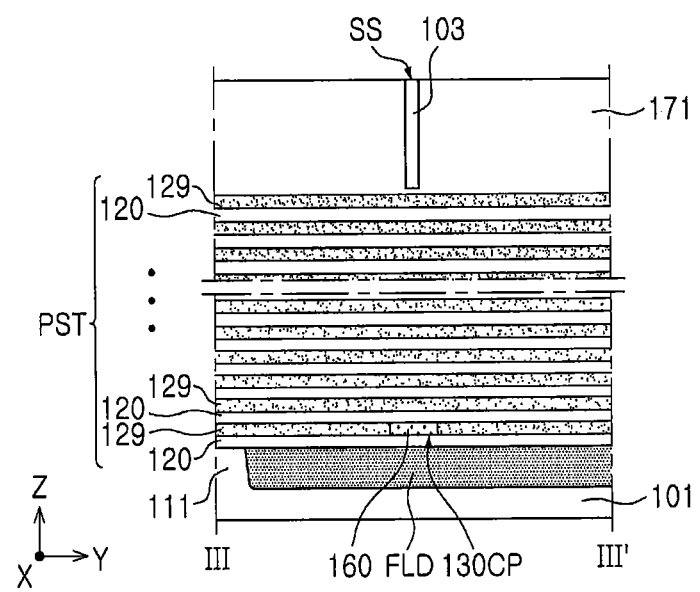
Figure 15A:
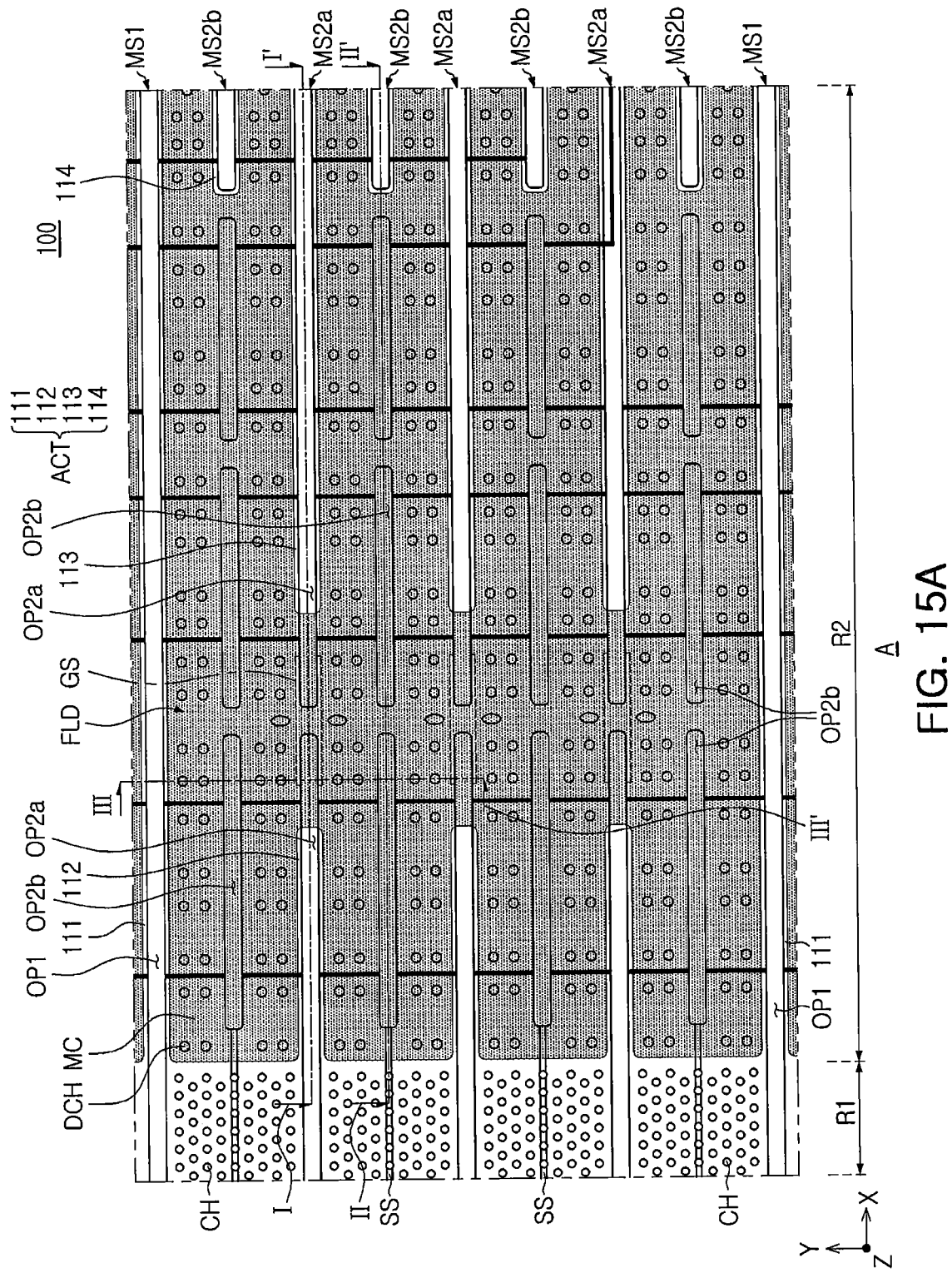
Figure 15B:
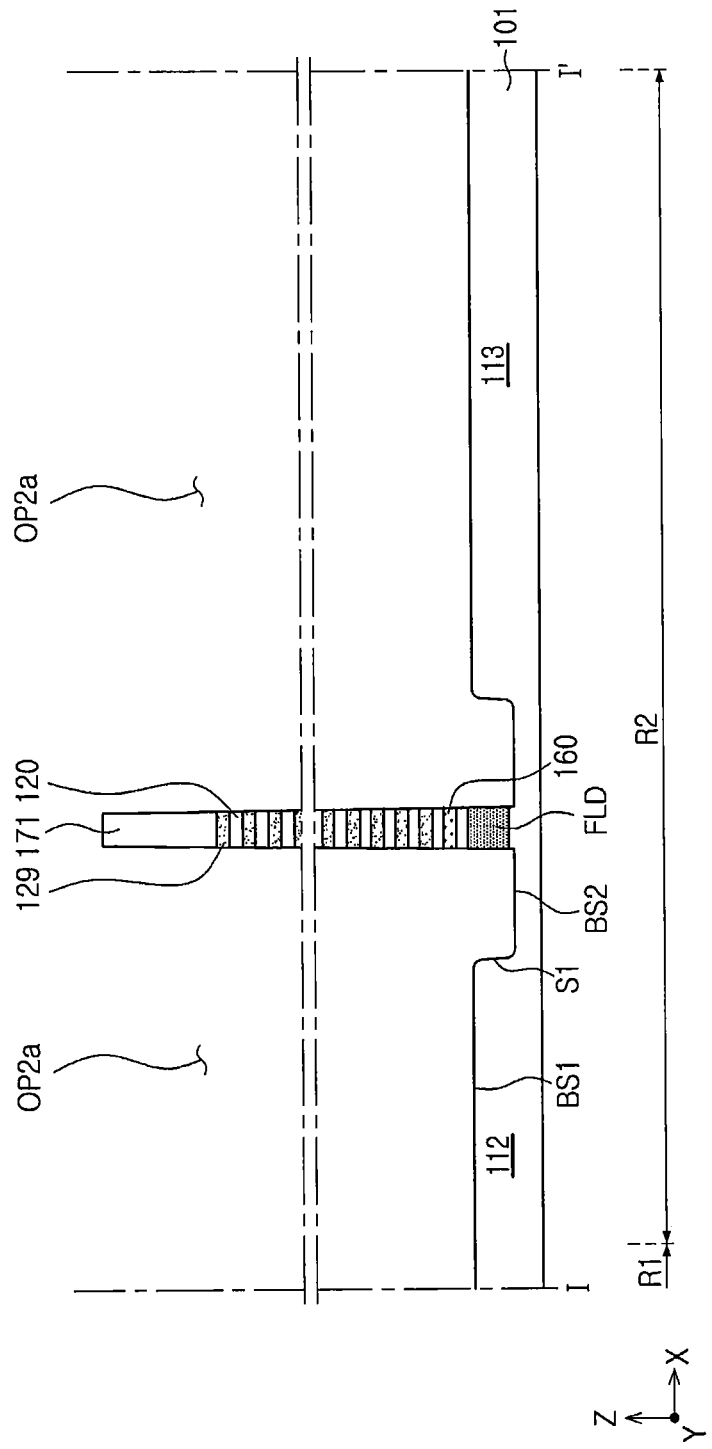
Figure 15C:
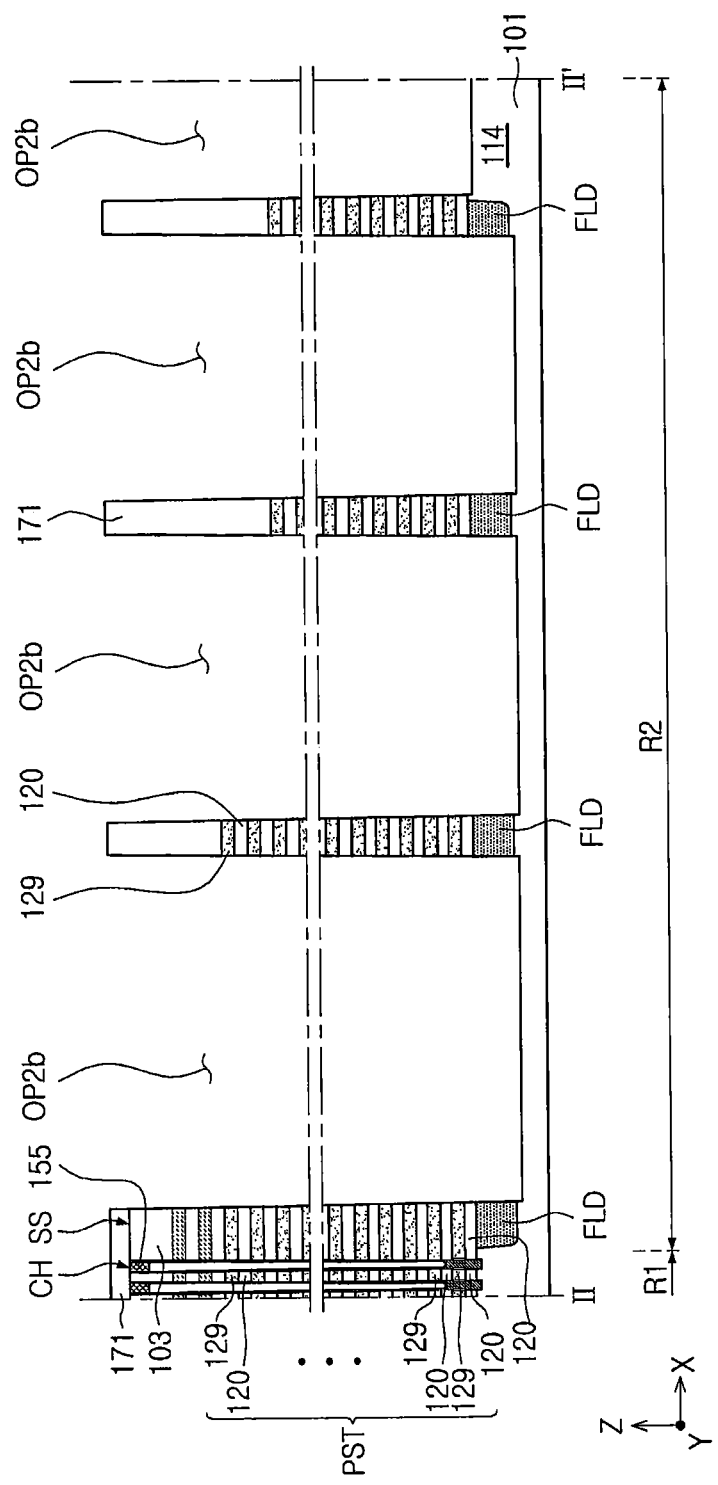
Figure 15D:
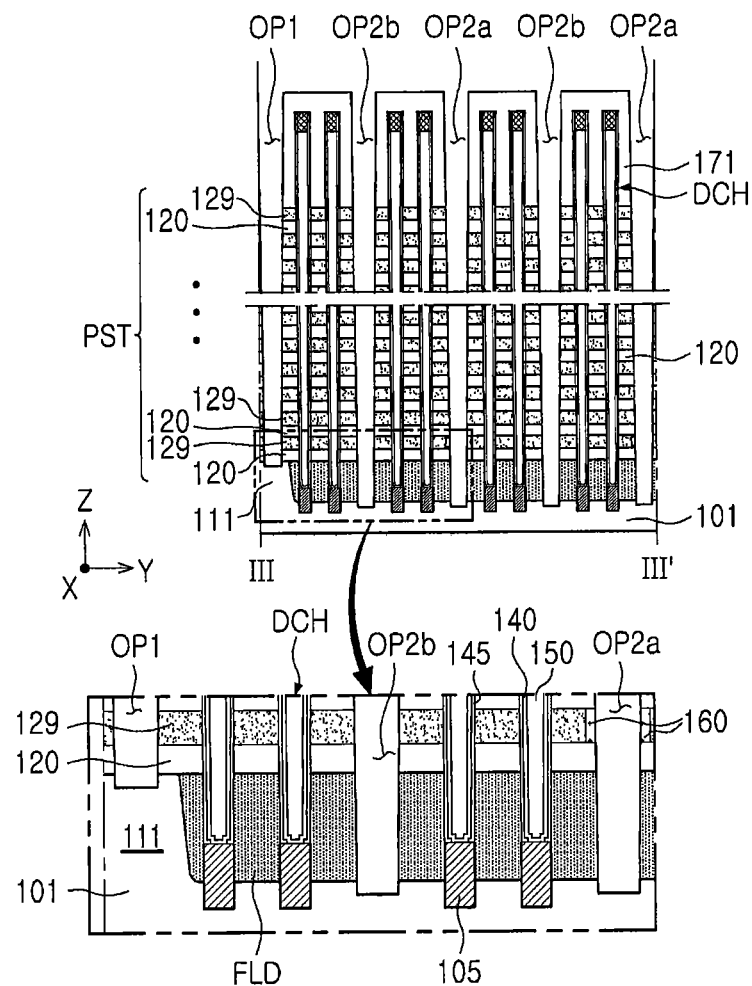

During formation of the sacrificial layers 129 and the interlayer insulating layers 120, a lowermost sacrificial layer 129 may be formed and then a patterning process and an insulating material deposition process may be performed to form a lower separation region GS including a lower insulating layer 160, as illustrated in FIGS. 14B and 14D. The lower insulating layer 160 may be formed of a material having an etching selectivity with respect to the sacrificial layers 129.

Before an upper insulating layer 103 is formed, a first capping insulating layer 171 may be formed to cover the preliminary stacked structure PST of the sacrificial layers 129 and the interlayer insulating layers 120. A region, in which an upper separation region SS is to be formed, may be exposed using an additional mask layer, and a predetermined number of sacrificial layers 129 and interlayer insulating layers 120 may be removed from an uppermost portion. The upper insulating layer 103 may be formed by depositing an insulating material in a region in which the sacrificial layers 129 and the interlayer insulating layers 120 are removed. The upper insulating layer 103 may be formed of a material having an etching selectivity with respect to the sacrificial layers 129, for example, the same material as the interlayer insulating layer 120.

The first capping insulating layer 171 may be formed to cover a portion of an upper surface of the substrate 101, an upper surface of an uppermost sacrificial layer 129 on the first region R1, and upper surfaces of the sacrificial layers 129 forming a step shape on the second region R2.

Referring to FIGS. 15A to 15D, a channel structure CH and a dummy channel structure DCH may be formed to penetrate through the preliminary stacked structure PST of the sacrificial layers 129 and the interlayer insulating layers 120. Openings OP1, OP2a, and OP2b may be formed to penetrate through the preliminary stacked structure PST of the sacrificial layers 129 and the interlayer insulating layers 120.

The channel structures CH and the dummy channel structures DCH may be formed by anisotropically etching the sacrificial layers 129 and the interlayer insulating layers 120, and may be formed in a hole shape. Due to a height of the stacked structure, sidewalls of the channel structures CH and the dummy channel structures DCH may not be perpendicular to the upper surface of the substrate 101. The channel structures CH may be formed in the first region R1 of the substrate 101, and the dummy channel structures DCH may be formed in the second region R2 of the substrate 101. The dummy channel structures DCH may be formed to penetrate through at least a portion of the insulating patterns FLD. In example embodiments, the channel structures CH and the dummy channel structures DCH may be formed to recess a portion of the substrate 101. However, according to example embodiments, the dummy channel structures DCH may extend only inwardly of the insulating patterns FLD without completely penetrating through the insulating patterns FLD and, and thus, may not be in contact with the substrate 101.

An epitaxial layer 105, at least a portion of a gate dielectric layer 145, a channel layer 140, a channel insulating layer 150, and channel pads 155 may be formed in the channel structures CH and the dummy channel structures DCH. When dummy channel structures DCH are further disposed in the first region R1 together with the channel structures CH in addition to the dummy channel structures DCH, the dummy channel structures DCH may also be formed together with the channel structures CH in this operation.

The epitaxial layer 105 may be formed using a selective epitaxy growth (SEG) process. The epitaxial layer 105 may include a single layer or a plurality of layers. The epitaxial layer 105 may include, for example, doped or undoped polycrystalline silicon, single crystalline silicon, polycrystalline germanium, and/or single crystalline germanium. In the dummy channel structures DCH, the epitaxial layers 105 may be formed such that an upper end of the epitaxial layers 105 is disposed within the insulating patterns FLD and at least a portion of a side surface of the epitaxial layer 105 is surrounded by the insulating patterns FLD. Accordingly, the epitaxial layers 105 may be disposed to be spaced apart from the sacrificial layers 129 in the dummy channel structures DCH.

The gate dielectric layer 145 may be formed to have a uniform thickness using atomic layer deposition (ALD) or chemical vapor deposition (CVD). In this operation, the entirety or a portion of the gate dielectric layer 145 may be formed. A portion, extending in a direction, perpendicular to the substrate 101, along the channel structures CH and the dummy channel structures DCH, may also be formed in this operation. The channel layer 140 may be formed on the gate dielectric layer 145 in the channel structures CH and the dummy channel structures DCH. The channel insulating layer 150 is formed to fill the channel structures CH and the dummy channel structures DCH, and may include an insulating material.

The openings OP1, OP2a, and OP2b may be formed by forming a mask layer using a photolithography process and anisotropically etching the stacked structure. Before the openings OP1, OP2a, and OP2b are formed, a first capping insulating layer 171 may be additionally formed on the channel structures CH and the dummy channel structures DCH to protect lower structures. The openings OP1, OP2a, and OP2b may be formed to have a trench shape in locations corresponding to the first and second separation regions MS1, MS2a, and MS2b, respectively. In this operation, the substrate 101 may be exposed below the openings OP1, OP2a, and OP2b.

The first opening OP1 may extend in the first direction X along the entire first and second regions R1 and R2. The first opening OP1 may be formed to partially recess the upper portions of the first active patterns 111 and/or to be in contact with upper surfaces of the first active patterns 111.

The second main opening OP2a may extend from the first region R1 to a portion of the second region R2 in the first direction X, and may be spaced apart therefrom to extend again in the second region R2. The second main opening OP2a may be formed to partially recess the upper portions of the second and third active patterns 112 and 113 and/or to be in contact with the upper surfaces of the second and third active patterns 112 and 113. The second main opening OP2a may be formed to penetrate through a portion of the insulating patterns FLD. Accordingly, the second main opening OP2a may form a first bottom surface BS1 and a second bottom surface BS2 disposed at different heights. The second bottom surface BS2 may be disposed below the first bottom surface BS1, based on the upper surface of the substrate 101. The second main opening OP2a may have an inclined lower side surface S1 connecting the first bottom surface BS1 and the second bottom surface B S2 to each other.

The second auxiliary opening OP2b may be formed in only the second region R2. The second auxiliary opening OP2b extends in the first direction X and may include a plurality of second auxiliary openings OP2b. The second auxiliary opening OP2b may have a vertical depth varying depending on the disposition of the insulating patterns FLD of the substrate 101. For example, a vertical depth of the second auxiliary opening OP2b, disposed to penetrate through the insulating patterns FLD, may be greater than a vertical depth of the second auxiliary opening OP2b disposed to be in contact with the fourth active patterns 114. According to example embodiments, bottom surfaces disposed at different heights may be formed in a single second auxiliary opening OP2b, similarly to the second main opening OP2a.

Referring to FIGS. 16A to 16C, the sacrificial layers 129 may be removed through the openings OP1, OP2a, and OP2b.

The sacrificial layers 129 may be selectively removed with respect to the interlayer insulating layers 120 using, for example, wet etching. Accordingly, a plurality of side openings may be formed between the interlayer insulating layers 120, and some sidewalls of the gate dielectric layer 145 and sidewalls of the interlayer insulating layer 120 of the channel structures CH may be exposed through the side openings. In this operation, stability of the stacked structure of the interlayer insulating layer 120 may be deteriorated after removal of the sacrificial layers 129, but the stacked structure may be stably supported by a region in which the openings OP1, OP2a, and OP2b are spaced apart from each other, the channel structures, and the dummy channel structures DCH.

Referring to FIGS. 17A to 17C, gate electrodes 130 may be formed by filling a region, in which the sacrificial layers 129 are removed, with a conductive material. Before the formation of the gate electrodes 130, a diffusion barrier layer 133 may be formed in the region in which the sacrificial layers 129 are removed. A separation insulating layer 107 may be formed in the openings OP1, OP2a, and OP2b.

The gate electrodes 130 may include, for example, a metal, polycrystalline silicon, a metal silicide material, or the like. The openings OP1, OP2a, and OP2b may provide a transfer path of a material for forming the gate electrodes 130. The gate electrodes 130 may be connected without being separated between the second openings OP2a and OP2b, disposed to be spaced apart on a straight line in the first direction X, to form gate connection portions. After the formation of the gate electrodes 130, the material forming the gate electrodes 130 deposited in the openings OP1, OP2a, and OP2b may be removed through an additional process.

The separation insulating layer 107 may include an insulating material. The separation insulating layer 107 may be formed to cover sidewalls of the openings OP1, OP2a, and OP2b. After the separation insulating layer 107 is formed to cover the bottom surfaces of the openings OP1, OP2a, and OP2b, a portion of a lower portion of the separation insulating layer 107 may be removed. In some embodiments, during removal of a portion of the lower portion of the separation insulating layer 107, bottom surfaces of the openings OP1, OP2a, and OP2b may extend further than lower ends of the separation insulating layer 107. In this case, as illustrated in FIG. 5A, the conductive layer 109 may be formed to have a lower end disposed on a lower level than a lower end of the separation insulating layer 107.

Referring to FIGS. 3B to 4D together, a conductive layer 109 may be formed in the openings OP1, OP2a, and OP2b. Then, upper interconnection structures such as channel contact plugs and bit lines may be further formed on the channel structures CH.

The conductive layer 109 may include a conductive material. Accordingly, first and second separation regions MS1, MS2a, and MS2b may be formed, and the first and second separation regions MS1, MS2a, and MS2b may be formed in the same process to have the same structure.

Figure 18A:
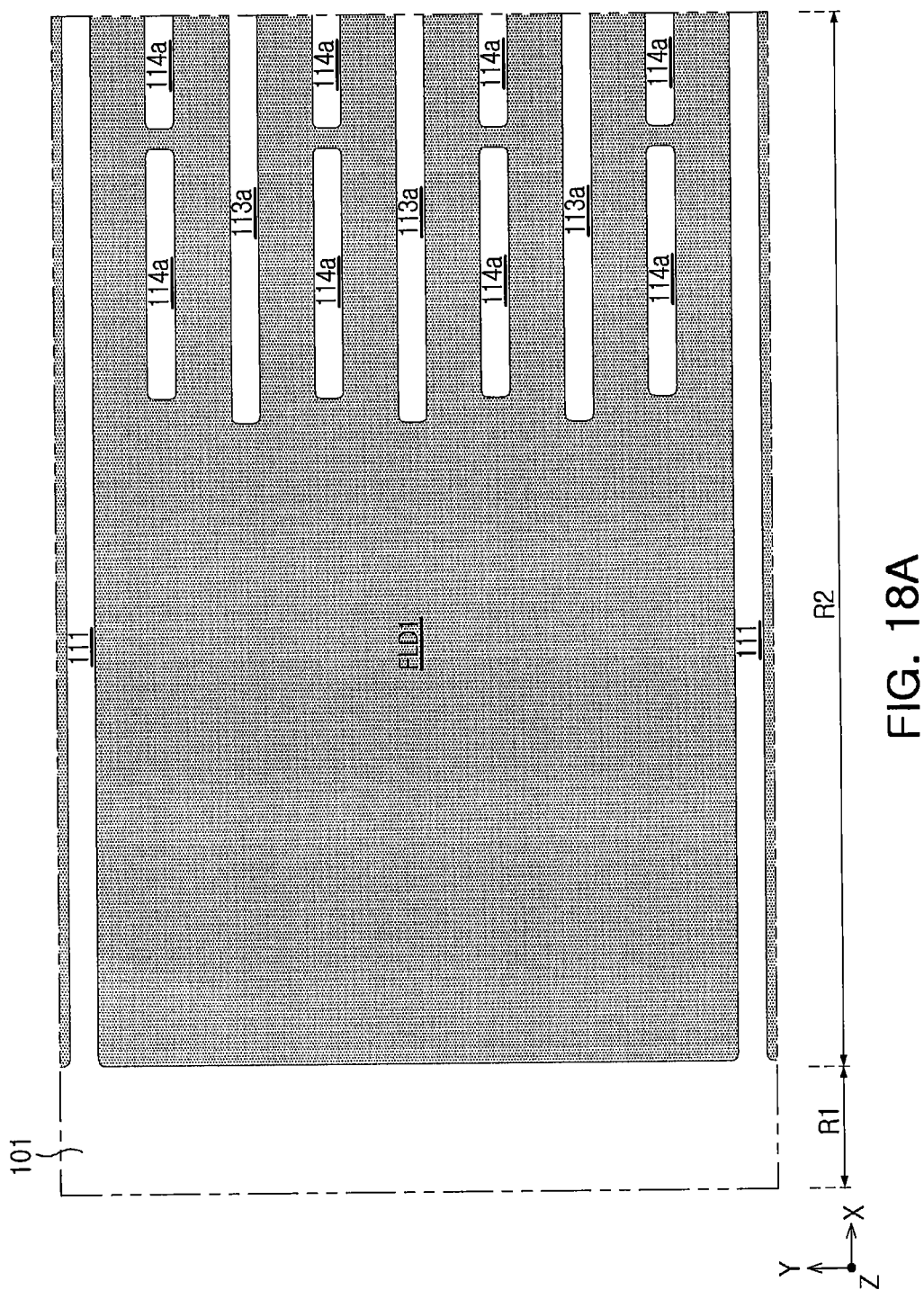
FIGS. 18A to 18C are schematic plan views illustrating a method of manufacturing a semiconductor device according to example embodiments of the present disclosure.

FIG. 18A illustrates a process of forming insulating patterns FLD1 and active patterns ACT1 in the substrate 101 to manufacture the semiconductor device 100a of FIGS. 6 to 7C. Then, the semiconductor device 100a may be manufactured by performing the same process as described above with reference to FIGS. 14A to 15D.

The insulating patterns FLD1 may be formed to increase an area occupied by the second region R2 adjacent to the first region R1. The active structure ACT1 may not include the second active patterns 112 disposed below a location in which the second main separation region MS2a_1 (see FIG. 4A) is to be formed.

Figure 18B:
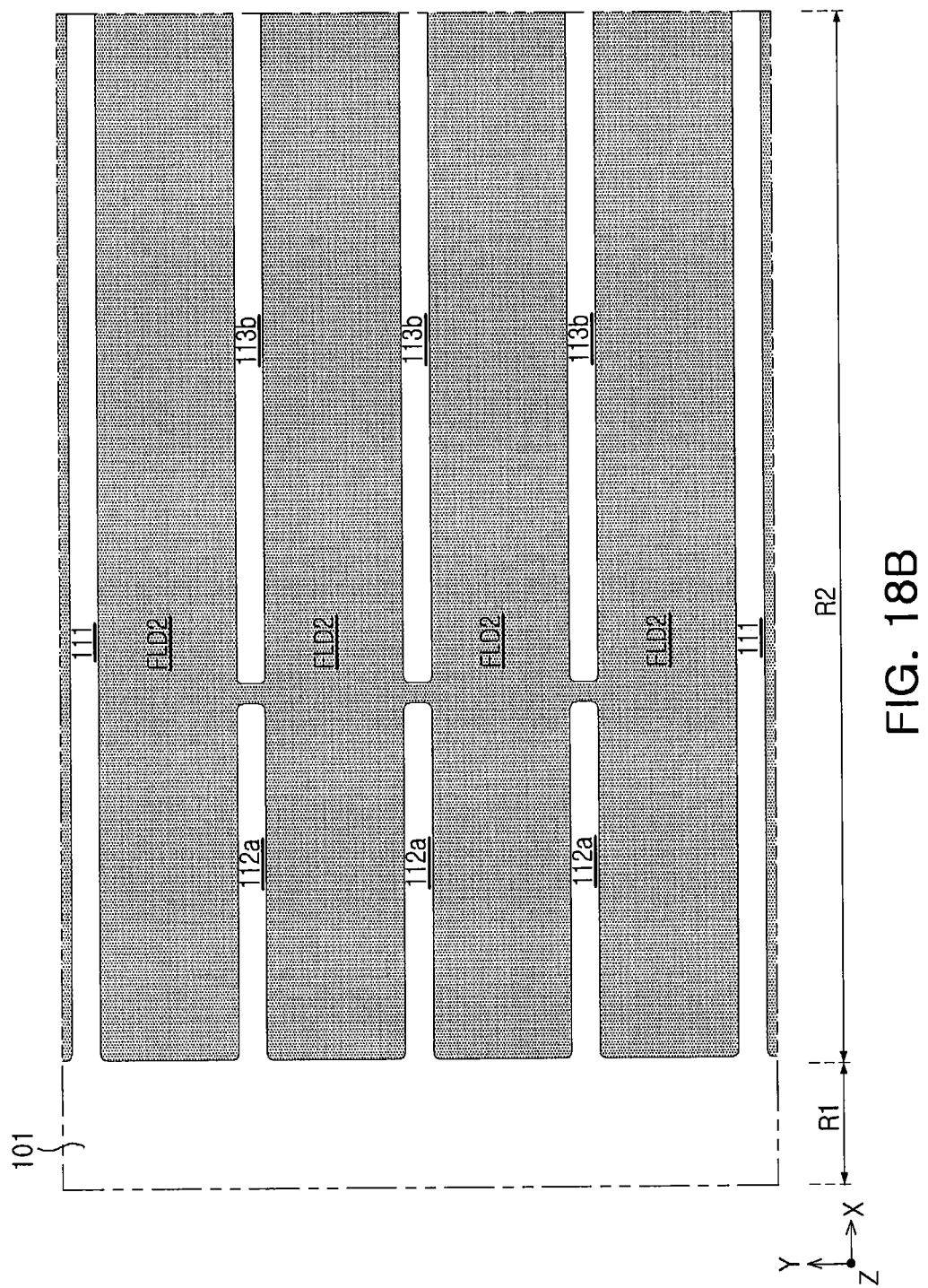

FIG. 18B illustrates a process of forming insulating patterns FLD2 and active patterns ACT2 in the substrate 101 to manufacture the semiconductor device 100b of FIGS. 8 to 9B. Then, the semiconductor device 100b may be manufactured by performing the same process as described above with reference to FIGS. 14A to 15D.

The insulating patterns FLD2 may not be formed below a location in which the first separation regions MS1 and the second main separation regions MS2a (see FIG. 3C) are to be formed. The insulating patterns FLD2 may be formed only below a location in which the second auxiliary separation regions MS2b (refer to FIG. 3C) are to be formed.

Figure 18C:
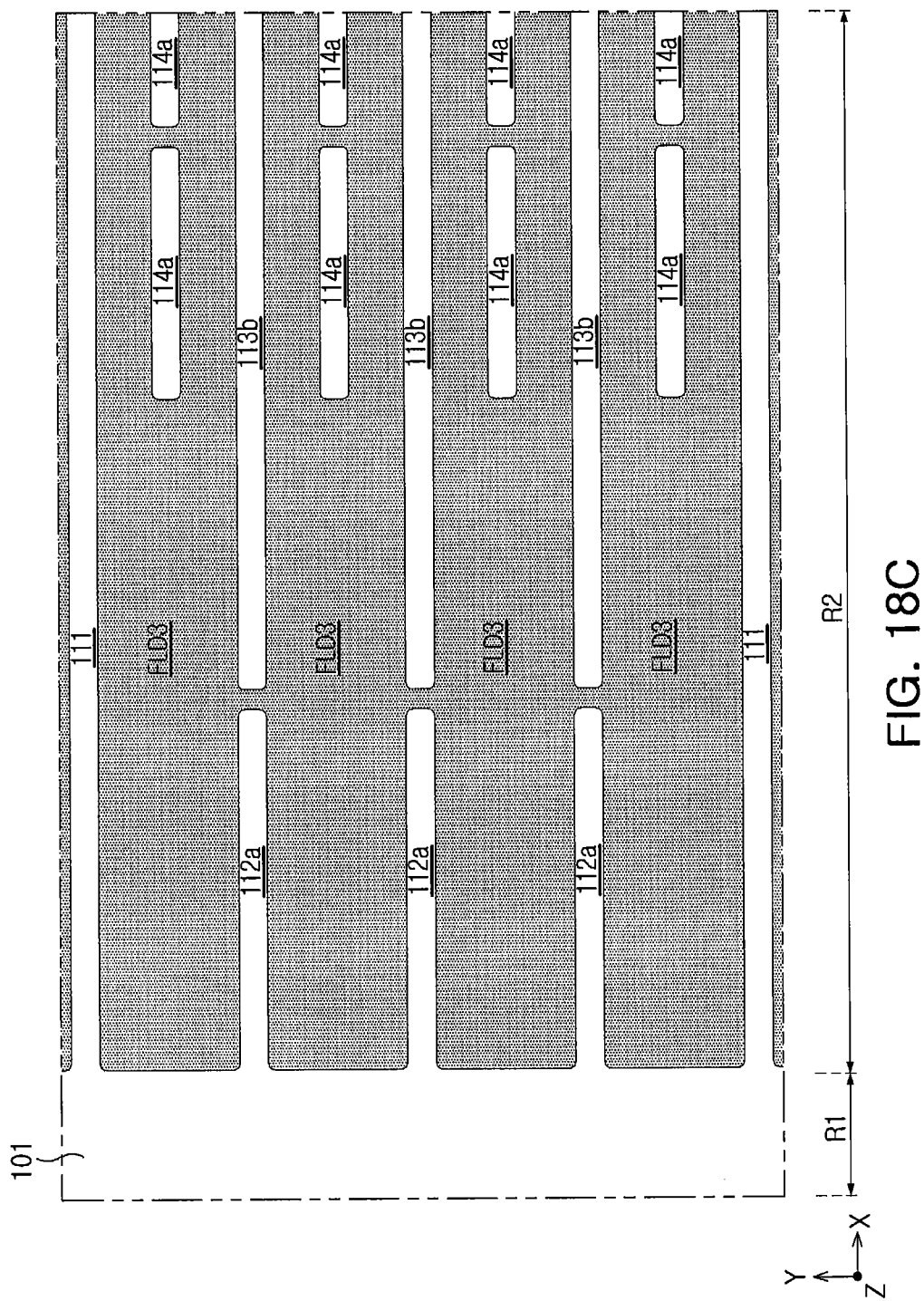

FIG. 18C illustrates a process of forming insulating patterns FLD3 and active patterns ACT3 in the substrate 101 to manufacture the semiconductor device 100c of FIGS. 10 to 11B. Then, the semiconductor device 100c may be manufactured by performing the same process as described above with reference to FIGS. 14A to 15D.

The insulating patterns FLD3 may not be formed below a location in which the first separation regions MS1 and the second main separation regions MS2a (see FIG. 3C) are to be formed. The insulating patterns FLD3 may not be formed below a location in which second auxiliary separation regions MS2b, disposed in a third or higher location from the first region R1 in the first direction X, among the second auxiliary separation regions MS2b (see FIG. 3C), are to be formed.

As described above, since an insulating pattern defining an active structure on a substrate may have various shapes, vertical depths of separation regions may be changed. A deterioration in electrical characteristics of a semiconductor device, caused by a poor pattern of a trench in which the separation regions are to be formed, may be reduced.

While example embodiments have been shown and described above, it will be apparent to those skilled in the art that modifications and variations could be made without departing from the scope of the present inventive concepts as defined by the appended claims.

What is claimed is:

1. A semiconductor device comprising:
a substrate comprising a first region and a second region;
insulating patterns in the substrate in the second region that define an active structure of the substrate;
a stacked structure comprising interlayer insulating layers and gate electrodes that are alternately stacked on the substrate;
first separation regions penetrating through the stacked structure, extending in a first direction, and spaced apart from each other in a second direction, perpendicular to the first direction;
second main separation regions penetrating through the stacked structure between the first separation regions and spaced apart from each other in the first direction;
second auxiliary separation regions penetrating through the stacked structure on the second region, spaced apart from the first separation regions and the second main separation regions in the second direction, and spaced apart from each other in the first direction; and
channel structures penetrating through the stacked structure on the first region,
wherein the active structure comprises first active patterns that are in contact with the first separation regions between the insulating patterns of the second region and extending in the first direction, and second active patterns extending for a shorter length than the first active patterns between the first active patterns,
wherein at least one of the second main separation regions comprises a first portion in contact with at least one of the second active patterns, and a second portion that extends through the insulating pattern to contact the substrate, and
wherein a lower end of the second portion is lower than a lower end of the first portion.

2. The semiconductor device of claim 1, wherein a second vertical depth between the lower end of the second portion and an upper end of the at least one of the second main separation regions is greater than a first vertical depth between the lower end of the first portion and the upper end of the at least one of the second main separation regions.

3. The semiconductor device of claim 1, wherein the first and second active patterns have a shape protruding upwardly farther than bottom surfaces of the insulating patterns, and
wherein the at least one of the second main separation regions extends to be in contact with the substrate below the bottom surfaces of the insulating patterns while being in contact with a portion of a side surface of the at least one of the second active patterns in the second region.

4. The semiconductor device of claim 1, wherein the active structure further comprises:
third active patterns spaced apart from respective ones of the second active patterns in the first direction and extending in the first direction collinearly with the respective ones of the second active patterns; and
fourth active patterns that are between the third active patterns and/or between the first active patterns and the third active patterns.

5. The semiconductor device of claim 4, wherein the second auxiliary separation regions include a first separation group and a second separation group spaced apart in the first direction,
wherein the first separation group is closer to the first region than the second separation group, and
wherein the second auxiliary separation regions of the first separation group penetrate through the insulating patterns, and the second auxiliary separation regions of the second separation group are in contact with the fourth active patterns.

6. The semiconductor device of claim 5, wherein lower ends of the second auxiliary separation regions of the first separation group are lower than lower ends of the second auxiliary separation regions of the second separation group.

7. The semiconductor device of claim 1, wherein each of the first separation regions, the second main separation regions, and the second auxiliary separation regions comprises a conductive layer in contact with the substrate and a separation insulating layer on side surfaces of the conductive layer.

8. The semiconductor device of claim 1, further comprising:
a lower separation region penetrating through a portion of a lowermost gate electrode among the gate electrodes on the second region and overlapping the insulating patterns in the second direction.

9. The semiconductor device of claim 8, wherein the at least one of the second main separation regions penetrates through a portion of the lower separation region.

10. A semiconductor device comprising:
a substrate comprising a first region and a second region;
insulating patterns in the substrate in the second region that define active patterns of the substrate;
gate electrodes spaced apart from each other and stacked on an upper surface of the substrate and extending in a first direction;
first separation regions extending in the first direction and in contact with the active patterns;
second separation regions extending in the first direction between the first separation regions; and
channel structures penetrating through the gate electrodes in the first region,
wherein at least one of the second separation regions is in contact with the substrate below the insulating patterns.

11. The semiconductor device of claim 10, wherein a lower end of the at least one of the second separation regions penetrates through at least one of the insulating patterns and is lower than lower ends of the first separation regions.

12. The semiconductor device of claim 10, wherein a lower portion of the at least one of the second separation regions comprises:
a first bottom surface at a first level;
a second bottom surface at a second level, different from the first level; and a side surface of the at least one of the second separation regions connecting the first bottom surface to the second bottom surface.

13. The semiconductor device of claim 10, wherein a plurality of the second separation regions are in contact with the active patterns.

14. The semiconductor device of claim 10, wherein the at least one of the second separation regions comprises a lower end that is lower than lower ends of the first separation regions.

15. The semiconductor device of claim 10, wherein the active patterns comprise:
   first active patterns extending in the first direction below the first separation regions; and
   a second active pattern and a third active pattern spaced apart from each other along a line in the first direction below the second separation regions.

16. The semiconductor device of claim 10, wherein the second separation regions comprise second main separation regions, extending from the first region to the second region, and second auxiliary separation regions extending on the second region, and
   wherein at least one of the insulating patterns is in contact with at least one of the second auxiliary separation regions.

17. A semiconductor device comprising:
   a substrate comprising a first region and a second region;
   gate electrodes spaced apart from each other and stacked on the substrate, at least two of the gate electrodes extending for different lengths in a first direction on the second region;
   first separation regions extending in the first direction, the first separation regions penetrating through the gate electrodes and spaced apart from each other in a direction perpendicular to the first direction; and
   a second separation region extending in the first direction from the first region to the second region between the first separation regions, the second separation region penetrating through the gate electrodes,
   wherein the second separation region has a first bottom surface at a first vertical distance from an upper surface of the second separation region in the second region, and a second bottom surface at a second vertical distance, greater than the first vertical distance, from the upper surface of the second separation region in the second region.

18. The semiconductor device of claim 17, wherein the second separation region has a first side surface connecting the first bottom surface and the second bottom surface to each other.

19. The semiconductor device of claim 18, wherein the second separation region has a second side surface extending from the second bottom surface away from the substrate, and
   wherein a first angle between the first side surface and the second bottom surface is greater than a second angle between the second side surface and the second bottom surface.

20. The semiconductor device of claim 17, further comprising:
   an insulating pattern in the substrate and having a bottom surface on a level between the first bottom surface and the second bottom surface.

* * * * *